(12) United States Patent
Ohmori et al.

(10) Patent No.: US 10,734,261 B2
(45) Date of Patent: Aug. 4, 2020

(54) SEARCH APPARATUS AND SEARCH METHOD

(71) Applicant: Hitachi, Ltd., Tokyo (JP)

(72) Inventors: Takeshi Ohmori, Tokyo (JP); Junichi Tanaka, Tokyo (JP); Hikaru Koyama, Tokyo (JP); Masaru Kurihara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 606 days.

(21) Appl. No.: 15/658,844

(22) Filed: Jul. 25, 2017

(65) Prior Publication Data

US 2018/0082873 A1 Mar. 22, 2018

(30) Foreign Application Priority Data

Sep. 21, 2016 (JP) ................................ 2016-184386

(51) Int. Cl.
*G06N 5/04* (2006.01)
*H01L 21/67* (2006.01)
(Continued)

(52) U.S. Cl.
CPC ......... *H01L 21/67276* (2013.01); *G01D 1/00* (2013.01); *G06F 16/90335* (2019.01);
(Continued)

(58) Field of Classification Search
CPC ...................................................... G06N 3/00
(Continued)

(56) References Cited

U.S. PATENT DOCUMENTS

2008/0295063 A1* 11/2008 Svidenko ............. G06F 30/398
716/55
2010/0080446 A1* 4/2010 Herschbein ........... G06T 7/0004
382/149
(Continued)

FOREIGN PATENT DOCUMENTS

| JP | 2013-518449 A | 5/2013 |
|---|---|---|
| TW | 511128 B | 11/2002 |
| TW | 201500950 A | 1/2015 |

OTHER PUBLICATIONS

Taiwanese Office Action in corresponding Taiwanese Application No. 106129091 dated Feb. 20, 2019.

*Primary Examiner* — David R Vincent
(74) *Attorney, Agent, or Firm* — Mattingly & Malur, PC

(57) ABSTRACT

A search apparatus receives an input target value, which indicates a condition to be set in a semiconductor processing apparatus or a result obtained by processing the semiconductor using the processing apparatus, a reference value of the condition inside a search area, and the result, wherein the reference value is indicated by the target value. A prediction model indicating a relation between the condition and the result based on a setting value of the condition inside the search area is generated and, a measured value of the result is obtained. A prediction value is acquired by assigning the target value to the prediction model. The prediction value is set to the reference value when it is determined that the prediction value is closer to the target value, and a prediction value satisfying an achievement condition is set when the prediction value satisfies the achievement condition of the target value.

14 Claims, 10 Drawing Sheets

(51) Int. Cl.
*G06F 16/903* (2019.01)
*H01L 21/66* (2006.01)
*G01D 1/00* (2006.01)
*G06N 3/02* (2006.01)

(52) U.S. Cl.
CPC ............... *G06N 5/04* (2013.01); *H01L 22/20* (2013.01); *G06N 3/02* (2013.01); *Y02P 90/30* (2015.11)

(58) Field of Classification Search
USPC .................................................. 706/15, 45
See application file for complete search history.

(56) References Cited

U.S. PATENT DOCUMENTS

| | | | |
|---|---|---|---|
| 2010/0138026 A1 | 6/2010 | Kaushal et al. | |
| 2013/0326439 A1* | 12/2013 | Matsuoka | G06F 30/00 716/55 |
| 2014/0282302 A1 | 9/2014 | Greiner et al. | |

* cited by examiner

SEARCH APPARATUS AND SEARCH METHOD

CLAIM OF PRIORITY

The present application claims priority from Japanese patent application JP 2016-184386 filed on Sep. 21, 2016, the content of which is hereby incorporated by reference into this application.

BACKGROUND OF THE INVENTION

1. Field of the Invention

The present invention relates to a search apparatus and a search method that searches a solution.

2. Description of the Related Art

New materials for forming a semiconductor device have been introduced in order to improve performance of the semiconductor device, and simultaneously, a structure of the semiconductor device has been complicated. In addition, nanometer-level accuracy is required in processing of the semiconductor device. In addition, it is required to continue a mass production process in the state of maintaining the accuracy as much as possible in order to improve productivity of the semiconductor device. In order to satisfy these requests, it is necessary for the semiconductor device to be capable of processing various types of materials and structures at extremely high accuracy. Accordingly, a control range of a semiconductor processing apparatus, which processes the semiconductor device, is increased, and multiple control parameters are added. It is possible to produce a high-performance semiconductor device while maintaining high productivity by employing the semiconductor processing apparatus.

Meanwhile, it is necessary to decide input parameters, which could be several types to several dozens of types for each semiconductor processing apparatus, in order to sufficiently draw out the performance of the semiconductor processing apparatus. Further, there are multiple steps in a single process, and it is necessary to change the input parameters every step. Accordingly, it is extremely difficult to ascertain combinations of the input parameters with which a target processing result is obtained.

In order to maintain and improve the productivity, it is necessary to acquire a state of the semiconductor processing apparatus in the middle of producing the semiconductor device and data of a processing result. A plurality of sensors and monitors aiming at the acquisition of such data are mounted to the semiconductor processing apparatus. It is necessary to analyze a relation between sensor data and monitor data, and the processing result and to find out a parameter for control in order to implement control for correction of data variations in the state of the semiconductor processing apparatus in the middle of producing the semiconductor device and the processing result. In order to perform nanometer-level processing control, the number of sensors and monitors for a manufacturing status, which are mounted to the semiconductor processing apparatus, have been increased, and a frequency of the data acquisition has been increased. Accordingly, the amount of acquired data is increased. Accordingly, it is necessary to analyze tremendous data and verify control performance in development of a control method for the high accuracy semiconductor processing apparatus thus demanded, which is extremely difficult.

It is required to develop a method of aging a semiconductor processing apparatus for structures of advanced devices such as the semiconductor device in order to secure the productivity. The method of aging the semiconductor processing apparatus is a method of suppressing a performance difference between semiconductor processing apparatuses, correcting a temporal change of processing characteristics during production and reducing a performance difference between the semiconductor processing apparatuses that has not been corrected by maintenance of the semiconductor processing apparatuses. The development of the method of aging the semiconductor processing apparatus is implemented by top engineers having high-level knowledge and techniques. However, the number of processed wafers and the number of highly difficult processes keep increasing in the manufacturing of the semiconductor device, and the shortage of top engineers become escalated. Thus, the number of processes in which data is acquired but the analysis thereof is not allowed by such shortage increase. Accordingly, it is required for the semiconductor processing apparatus to have a function of automatically drawing out the performance of the semiconductor processing apparatus by the own semiconductor processing apparatus and a function of supporting an engineer who draws out the performance of the semiconductor processing apparatus.

JP 2013-518449 A discloses a technique of learning data at the time of incrementally or arbitrarily changing a recipe of a manufacturing tool and generating a recipe adjusted using a result of the learning, using an autonomous learning system based on biology.

SUMMARY OF THE INVENTION

For example, an input parameter of the semiconductor processing apparatus is a parameter that decides an operation of the semiconductor processing apparatus, and examples of the input parameter include a gas type, a gas flow rate, pressure, input power, a voltage, a current, processing time, heating temperature, cooling temperature, a dose amount, and a light amount. An output parameter of the semiconductor processing apparatus is a parameter which is obtained by monitoring or measuring an object to be processed (processing result), in the middle of or after being processed by the semiconductor processing apparatus, and examples thereof include a critical dimension (CD), a deposited film thickness, an etch rate (ER), a processing shape, a mask selection ratio, and output parameters indicating processing result such as wafer in-plane distribution and uniformity of these data. In addition, examples of sensor data and monitor data relating to these processing results include a light reflection spectrum, a plasma light spectrum, a wafer incident current, a wafer voltage, wafer temperature, apparatus part temperature, and data indicating spatial distribution and uniformity of these data. The sensor data and the monitor data also belong to the output parameter.

It is necessary to be capable of analyzing the input and output data from one input and one output to multiple inputs and multiple outputs in order to analyze a relation between the input and output of the semiconductor processing apparatus. Further, it is necessary to search a wide apparatus parameter space formed of the input parameters and the output parameters in order to obtain a combination of input parameters that satisfy a target output result.

For example, it is considered a case where five basic types of input parameters, that is, each flow rate of two types of use gases, gas pressure, discharge power, and wafer application bias power are selected as input parameters to search. Each control range of the input parameters is as follow. Typical ranges are set such that the control range of both the gas flow rates is 100 to 200 [sccm], the control range of the gas pressure is 1 to 10 [Pa], the control range of the discharge power is 500 to 1500 [W], and the control range of the bias power is 0 to 100 [W]. Incidentally, typical values of minimum widths at the time of changing the respective parameters are as follow. The value of both the gas flow rates is 1 [sccm], the value of the gas pressure is 0.1 [Pa], the value of the discharge power is 1 [W], and the value of the bias power is 1 [W].

In this case, when all combinations of the control ranges of the input parameters in the entire apparatus parameter space, that is, the number of search conditions are roughly calculated, $100 \times 100 \times 100 \times 1000 \times 100 = 10^{11}$ is obtained. When the time taken for one-time search is about one minute, it takes 100 thousand years or more for the entire search of the total number of search conditions, and the execution thereof is impossible.

In addition, when a setting number of a value for each input parameter in one set of search is set to ten, the number of combinations of the input parameters in the search is $10^5$. When the time taken for one-time search is about one minute, it requires time corresponding to two months or more for one set of search. It is necessary to set the time taken for one set of search to be several days or less, and desirably one hour or less at the longest in order to reach a target solution by repeating the search and analysis of search results. Accordingly, the setting of the input parameters in the search, that is, decision of the search area is extremely important in order to reach the target solution.

When 2000 conditions are searched during a day by setting the number of search conditions during one set of search to 100 conditions and the search time to one hour and repeating the search, an area of 0.000002% of the number of conditions of the apparatus parameter space of $10^{11}$ is searched in a day. When such search is continued for one month, that is, 60 thousand sets of search are executed, an area of 0.00006% of the apparatus parameter space is searched. Accordingly, when a search area is arbitrarily changed in a case where the search area in one set of search is narrow, the possibility of reaching an optimal solution is extremely low. In addition, the time required to reach the optimal solution is further increased when there is an overlapping search area.

Further, the relation between the input and output of the semiconductor processing apparatus is non-linear in most cases, and multiple local solutions are present in the apparatus parameter space. Thus, it is extremely rare to find out values of input parameters that satisfies values of output parameters through one time of data analysis and estimation. When a case where approximately one local solution is present in a search area of 1% of the apparatus parameter space is considered, the local solution is obtained with a probability of 99% even if it is assumed that an optimal solution in the search area or in the vicinity of the search area is obtained in a case where the search area is set to a narrow area and the search area is arbitrarily selected. Accordingly, it is necessary to decide the search area so as to enhance the possibility of efficiently avoiding the local solution or allowing the reaching to the solution after reaching the local solution.

However, the above-described technique in JP 2013-518449 A has a problem that the possibility of reaching an optimal solution which is an input parameter serving as a solution is extremely low since the recipe is just incrementally or arbitrarily changed at the time of data learning. In other words, there is a problem that the possibility of reaching the local solution which is an inferior result as compared to the optimal solution becomes extremely high.

An object of the present invention is to achieve efficiency in operation of a semiconductor processing apparatus.

A search apparatus and a search method serving as an aspect of each invention disclosed in the present application are configured: to receive each input of a target value, which indicates a condition to be set in a semiconductor processing apparatus to process a semiconductor or a result obtained by processing the semiconductor using the semiconductor processing apparatus, a reference value of the condition inside a search area defined by ranges of the condition and the result, and the result, the reference value indicated by the target value; to generate a prediction model indicating a relation between the condition and the result based on a setting value of the condition inside the search area, a measured value of the result obtained when the setting value is assigned to the semiconductor processing apparatus; to acquire a prediction value from the prediction model by assigning the input target value to the generated prediction model and specify a presence area of the prediction value from the search area; to determine whether the measured value of the result corresponding to the prediction value is closer to the target value than the input reference value; to set the prediction value to the reference value when it is determined that the measured value of the result corresponding to the prediction value is closer to the target value, and sets the prediction value presence area to the search area; and to output a prediction value satisfying an achievement condition when the measured value of the result corresponding to the prediction value satisfies the achievement condition of the target value.

According to a representative embodiment of the present invention, it is possible to achieve the efficiency in operation and optimization of processing of the semiconductor processing apparatus. Other objects, configurations, and effects which have not been described above become apparent from embodiments to be described hereinafter.

DESCRIPTION OF THE PREFERRED EMBODIMENTS

Search Example of Input Parameter

Figure 1:
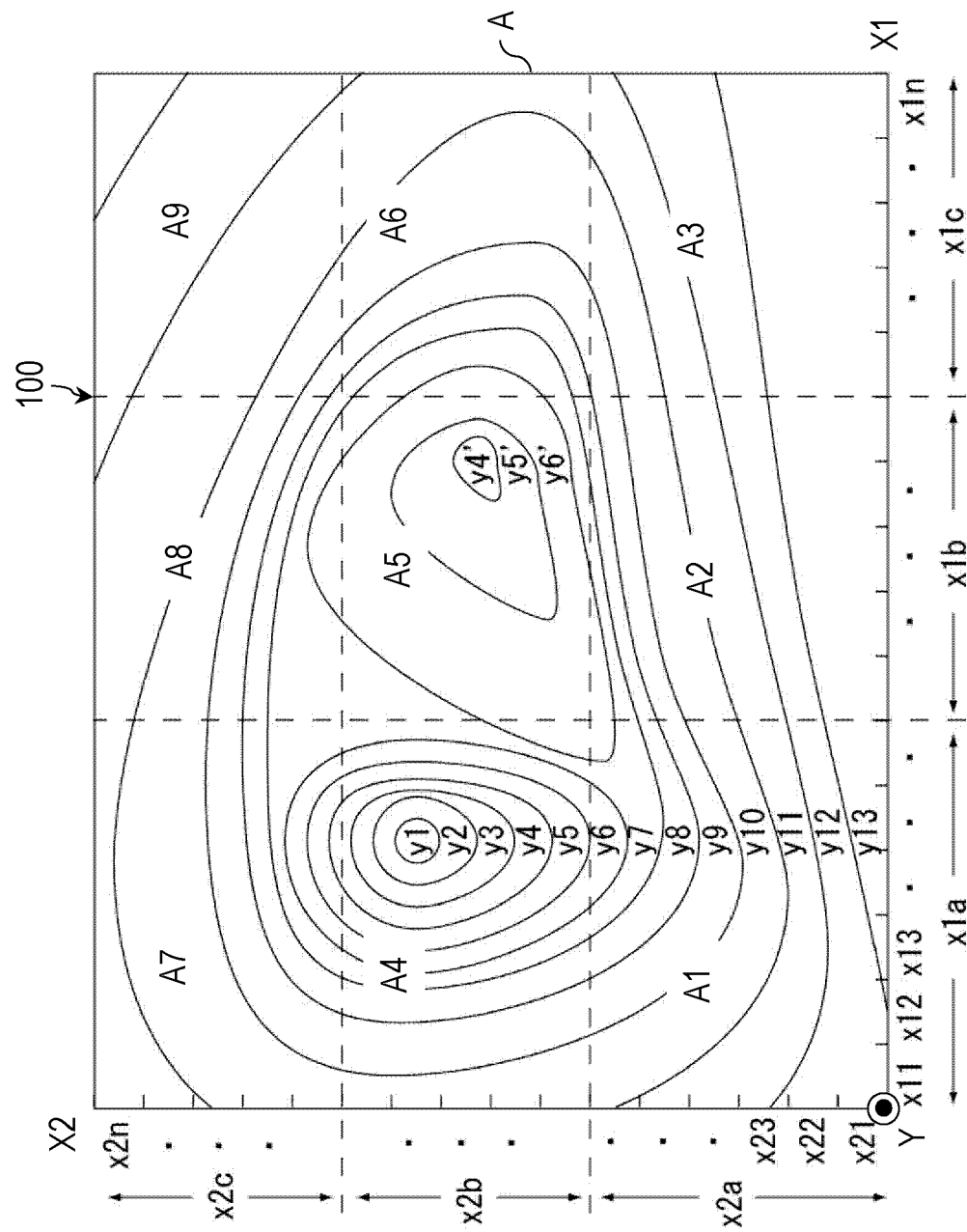
FIG. 1 is an explanatory diagram illustrating a search example of an input parameter.

FIG. 1 is an explanatory diagram illustrating a search example of an input parameter. FIG. 1 illustrates an example of a combination between input data and output data with respect to a semiconductor processing apparatus at the time of searching the input data (a value of the above-described input parameter) that enables the output data (a value of the above-described output parameter), which satisfies a target, to be obtained in the semiconductor processing apparatus.

Here, the semiconductor processing apparatus is an apparatus that processes a semiconductor or a semiconductor device including the semiconductor. To be specific, examples of the semiconductor processing apparatus include a lithographic apparatus, a film forming apparatus, a pattern processing apparatus, an ion implanting apparatus, a heating apparatus, and a cleaning apparatus. Examples of the lithographic apparatus include an exposure apparatus, an electron beam drawing apparatus, and an X-ray drawing apparatus. Examples of the film forming apparatus include a vapor deposition apparatus using chemical vapor deposition (CVD) or physical vapor deposition (PVD), a sputtering apparatus, and a thermal oxidation apparatus. Examples of the pattern processing apparatus include a wet etching apparatus, a dry etching apparatus, an electron beam processing apparatus, and a laser processing apparatus. Examples of the ion implanting apparatus include a plasma doping apparatus and an ion beam doping apparatus. Examples of the heating apparatus include a resistance heating apparatus, a lamp heating apparatus, and a laser heating apparatus. Examples of the cleaning apparatus include a liquid cleaning apparatus and an ultrasonic cleaning apparatus.

FIG. 1 illustrates a graph 100 having two-dimensional coordinate plane with two axes of an X1-axis and an X2-axis. An axis orthogonal to the coordinate plane is set as a Y-axis. The X1-axis is a coordinate axis of an input parameter X1, which serves as input to the semiconductor processing apparatus, and the X2-axis is a coordinate axis of an input parameter X2 which serves as input to the semiconductor processing apparatus. Input data x1$n$ (n=1, 2, 3, and so on) as a value of the input parameter X1 is plotted in the X1-axis, and input data x2$n$ as a value of the input parameter X2 is plotted in the X2-axis. The graph 100 expresses output data in the Y-axis in each area decided by the input data x1$n$ and x2$n$ using contour lines. For example, an area including output data y1 is set as a maximum value (that is, an optimal solution), and an area including output data y13 is set as a minimum value. In addition, the X1-axis is divided into three to obtain areas x1$a$, x1$b$ and x1$c$ in the graph 100. Similarly, the X2-axis is divided into three to obtain areas x2$a$, x2$b$ and x2$c$ in the graph 100.

For example, when an area where the output data is the highest, that is, a combination of the input data x1$n$ and x2$n$, which allows the output data y1 to be obtained, is searched as a target, an inclination of output data y$n$ in the apparatus parameter space may be acquired as an analysis method, and the search may be conducted in a direction in which the output data y$n$ increases.

However, when the output data at this time does not include output data in the area decided by the input data x1$a$ and x2$b$, the search proceeds toward output data y4' at a vertex serving as a local solution. In addition, when an input parameter that needs to be searched depending on a result thereof is decided, output data in the vicinity of the output data y4' is intensively acquired, and an input parameter, which allows the output data y4' or output data significantly close to the output data y4' to be obtained, is found. That is, it is difficult to find input data as an optimal solution, which corresponds to the output data y1, even if repeating analysis using a value of the input parameter acquired by the search and acquisition of a value of the output parameter obtained through the additional search.

In addition, when multiple local solutions are present around the output data y1 or in other areas, there is a possibility that the search falls into the local solution and it is difficult to find the output data y1 if the acquired value of the input parameter is too small with respect to a breadth of the apparatus parameter space. In addition, it is assumed that an area of parameters x13 and x23 is estimated as an area where an estimated solution is present. Thereafter, if the search area is limited to a tiny area such as a part of the area defined by the parameters x13 and x23 as in JP 2013-518449 A, the inclination of the output data y$n$ is significantly small, and thus, there is a possibility that the number of times of search until arriving at the output data y1 becomes enormous and the search fails. In addition, there is a possibility that the search fails as the inclination of the output data y$n$ is buried in noise included in the output data y$n$. A poor result is inevitably obtained from estimation of a solution if the quality of the output data y$n$ serving as an analysis target is poor, and thus, it is necessary to designate a search space for acquisition of data with favorable quality which enables approximation to the solution in order to succeed in the search.

In FIG. 1, the three parameters of x1$n$, x2$n$ and y$n$ are used. There are multiple input and output parameters in an actual semiconductor processing apparatus, and thus, a vast apparatus parameter space obtained by multidimensional vectorization of indices of the respective axes of FIG. 1 is searched. Accordingly, it is necessary to designate an apparatus parameter space in order to acquire data with favorable quality which enables efficient approximation to the solution from such a vast apparatus parameter space. In addition, a relation between the input and output of the semiconductor processing apparatus is non-linear in most cases, and multiple local solutions are present in the apparatus parameter space.

In this embodiment, an experiment condition for search of an apparatus parameter space is automatically decided upon consideration of an analysis result of input and output data of the semiconductor processing apparatus, verification of an experiment result is automatically performed, and these automatic operations are repeated. Accordingly, the apparatus parameter space is searched, and an optimal solution is efficiently acquired. That is, a value of an input parameter, which allows a value of an output parameter indicating a state of the semiconductor processing apparatus and a processing result serving as targets to be obtained, is efficiently found.

System Configuration Example

Figure 2:
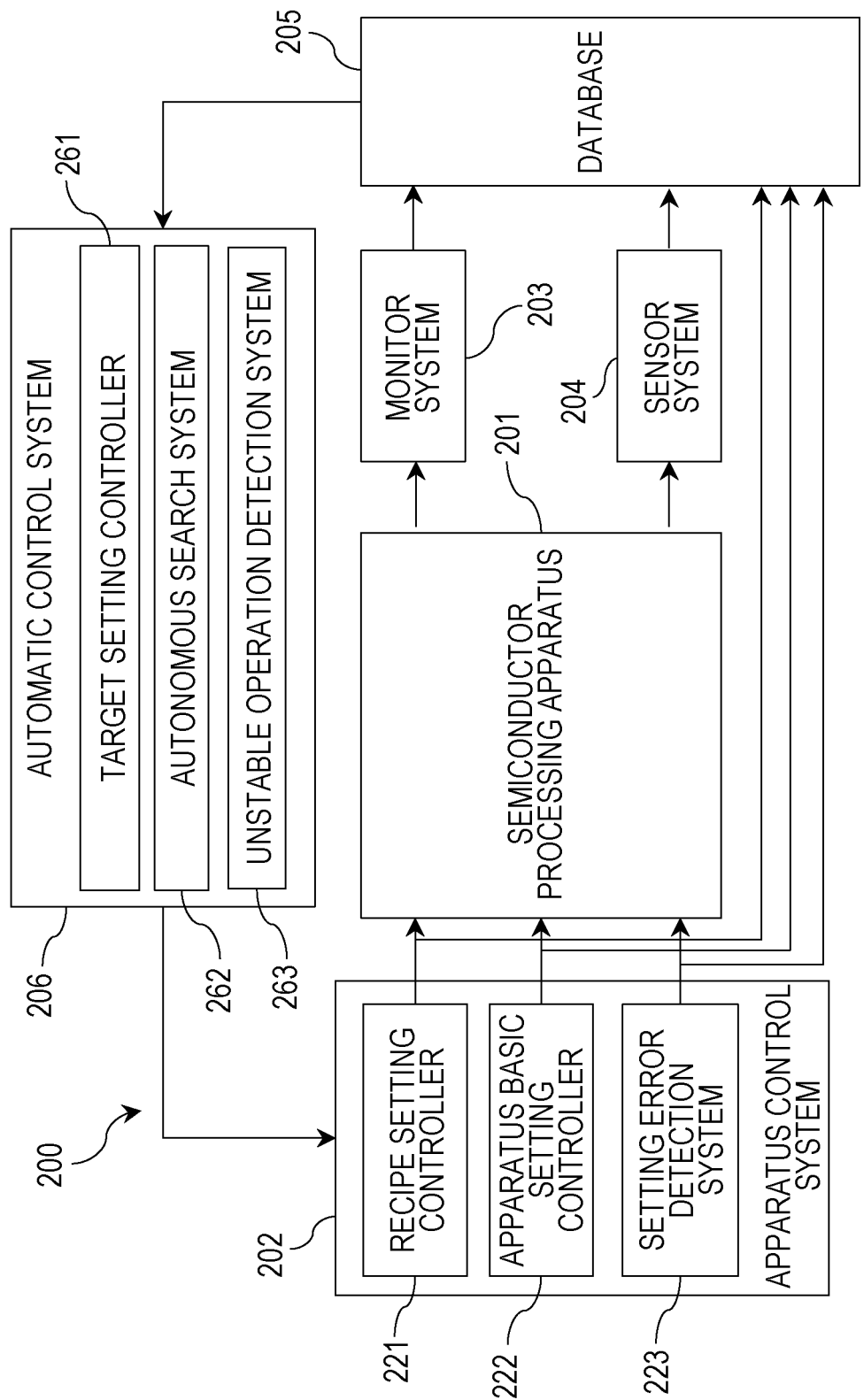
FIG. 2 is an explanatory diagram illustrating a system configuration example of a semiconductor manufacturing system.

FIG. 2 is an explanatory diagram illustrating a system configuration example of a semiconductor manufacturing system. A semiconductor manufacturing system 200 includes a semiconductor processing apparatus 201, an apparatus control system 202, a monitor system 203, a sensor system 204, a database 205, and an automatic control system (search apparatus) 206.

The semiconductor processing apparatus 201 is the apparatus that processes a substrate such as a wafer or the semiconductor device as described above. The semiconductor processing apparatus 201 is connected to the apparatus control system 202, the monitor system 203, and the sensor system 204.

The apparatus control system 202 is a system that controls the semiconductor processing apparatus 201 during running and processing of the semiconductor processing apparatus 201. The apparatus control system 202 includes an input interface, such as a GUI, and controls execution of the semiconductor processing apparatus 201 using a value of an input parameter input via the input interface. In addition, the apparatus control system 202 includes a network interface and acquires a value of an input parameter from an external computer and the database 205 via the network interface.

The apparatus control system 202 includes a recipe setting controller 221, an apparatus basic setting controller 222, and a setting error detection system 223. The recipe setting controller 221 sets an input parameter that decides an operation during the processing of the semiconductor processing apparatus 201 and a value of the input parameter to the semiconductor processing apparatus 201. The apparatus basic setting controller 222 sets an input parameter that allows the running of the semiconductor processing apparatus 201 and a value of the input parameter to the semiconductor processing apparatus 201.

The setting error detection system 223 determines whether it is possible to actually set the input parameter to the semiconductor processing apparatus 201 at the time of setting the input parameter in the apparatus basic setting controller 222. To be specific, for example, the setting error detection system 223 determines whether an input parameter that has been input is within a range of enabling the input and it is a combination of values of input parameters that enables the operation of the semiconductor processing apparatus 201. When a value of the input parameter that is hardly set or a combination of such values is detected, the setting error detection system 223 reports this setting error to an engineer or an upper-level system to which the semiconductor processing apparatus 201 is connected. When the setting error is generated, a stop of changing of the input parameter that has been input or a stop of the processing using the value of the input parameter that has been input is recorded as log data.

The monitor system 203 is a system that monitors or measures an object to be processed (processing result) which is in the middle of being processed or has been processed by the semiconductor processing apparatus 201 to acquire monitor data. The monitor system 203 includes an optical monitor, a processing dimension measurement apparatus using an electronic microscope, a temperature measurement apparatus using infrared light, a defect detection apparatus using a Kelvin probe force microscope, and a prober apparatus that evaluates electrical characteristics of the object to be processed. For example, the monitor system 203 acquires a processing shape of the object to be processed, a thickness of a film to be processed, and a processing defect as the monitor data by measuring reflection, transmission, absorption, and a polarization spectrum at the time of causing light, laser light, and X-ray to be incident to the object to be processed. It is unnecessary for the monitor system 203 to be directly connected to the semiconductor processing apparatus 201, and a measurement result may be acquired by transporting the object to be processed to the monitor system 203 and the result may be saved in the database 205.

The monitor system 203 monitors a medium which is used in processing of a plasma, a gas, a liquid, and the like, which act on the object to be processed during the processing, and a product generated by the processing. These medium and product are substances that directly act with the object to be processed or are generated as a result of the action. The monitor system 203 includes a plasma-emission monitor using optical spectrum measurement, a sediment monitor, which uses an infrared spectroscopic measurement, inside a processing chamber, a monitor for atoms and molecules, discharged from the object to be processed, using a mass spectrometer, and a monitor for electrical characteristics inside the processing chamber using a probe. The monitoring using these monitors can measure the monitor data, which enables indirect evaluation of the processing result, in real-time and during the processing directly at a processing site.

The sensor system 204 is a system that acquires sensor data which indicates an apparatus state of the semiconductor processing apparatus 201. The sensor system 204 is an assembly of sensors. The sensor data includes power output values, such as a voltage, a current, and power, values of variable electrical elements, such as a capacitor and a coil inside the matching device, each flow rate of various use gases, each temperature of an apparatus framework and apparatus components, pressure inside the processing chamber, an opening degree of a pressure control valve, a valve opening and closing state, gas exhaust speed, and operation timing and operation time of processing and the apparatus.

The database 205 saves values of various input parameters set by the apparatus control system 202, a value of the output parameter serving as the processing result from the semiconductor processing apparatus 201, and the monitor data and the sensor data acquired by the monitor system 203 and the sensor system 204. In addition, the database 205 saves learning data. The learning data is input and output data serving as a combination of a value (input data) of an input parameter, which has been assigned to the semiconductor processing apparatus 201 in the past, and a value (output data) of an output parameter output from the semiconductor processing apparatus 201. The database 205 may be the distributed database 205 which saves various types of data to be saved in different storage devices 302. A distributed database in a mode of saving information to be handled by each system in each system may be constructed.

The automatic control system 206 searches a solution that satisfies a target using the data saved in the database 205. The solution that satisfies the target is a value of at least one parameter among the value of the input parameter used for the running of the semiconductor processing apparatus 201 and the value of the input parameter used for the operation during the processing of the semiconductor processing apparatus 201. The automatic control system 206 includes a target setting controller 261, an autonomous search system 262, and an unstable operation detection system 263.

The target setting controller 261 receives an input of the values of the input parameters and the value of the output parameter serving as the target, and an allowable value of a difference or a divergence between a search result and the target, as initial values before starting the search. In addition, the target setting controller 261 can receive an input of an upper limit of time to execute one condition in the search, the number of times of search, an upper limit of the total time taken for one set of search, an upper limit of the total time taken for the entire search, an upper limit of time for analysis of a search result, and an upper limit of the number of analysis data. In addition, the target setting controller 261 can set the availability of search with respect to the respective input parameters and set an upper limit value and a lower limit value of a control range of the input parameter to search and values to limit the control range of the input parameter to search. Further, the target setting controller 261 can receive an input of an optimal solution before starting the search which includes a past result, analysis target data which has been used to obtain the solution, and a model function describing a relation between a target obtained by the analysis and the input parameter.

The autonomous search system 262 acquires content that has been input to the target setting controller 261 and sets division areas, which are obtained by dividing the control range of the input parameters that can be searched into two or more areas, with respect to one or more parameters. As described above, it is necessary to set the time taken for one set of search to be several days or less, and desirably one hour or less at the longest in order to reach a target solution by repeating the search and analysis of search results. That is, when the number of search conditions for one set of search is Ns, search time taken for one set of search is Ts [min], and time required for one search condition is t1 [min], the number of times of search is given as Formula (1.1).

$$Ts = t1 \cdot Ns \quad (1.1)$$

When the number of search conditions Ns may be decided such that Ts≤1440 in the case of finishing one set of search within a day, or Ts≤60 in the case of finishing one set of search within an hour.

It is effective to shorten each measurement time of the sensor and the monitor, which evaluate the search result, in order to increase the number of search conditions Ns. In particular, it is effective to use the sensor and the monitor which can perform the measurement in real-time in the search experiment.

In addition, it is possible to perform the measurement in real-time and during the processing directly at the processing site by measuring characteristics of the medium acting on the object to be processed and the product generated by the processing, which serve as the data that enables the indirect evaluation of the processing result, using the sensor and the monitor.

The search time Ts rapidly increases along with an increase of types of input parameters to be changed in the search. For example, when the number Da of types of input parameters is set such that Da=10 and an area division number A of each parameter is set such that A=3, the number of search conditions Ns in the case of searching combinations of all parameters is given as Formula (1.2).

$$Ns = A^{Da} \quad (1.2)$$

The number of search conditions Ns is increased up to 59049. In this case, it is preferable to predict each value of the input parameters, predicted to have a solution, and limit the number of input parameters that can be changed at the same time during the search using the prediction value as a center condition. Accordingly, the number of search conditions Ns and the search time Ts become values that can be executed. It is possible to use the past search result or knowledge of the engineer at the time of predicting the center condition. Alternatively, it is also possible to assign a suitable center condition as an initial value of search and start the search.

For example, when division areas, estimated to have a solution, are designated for five types among ten types of the input parameters, it is possible to decrease the number of search conditions Ns in the next search up to $Ns=3^5=243$ by changing the other five types of the input parameters. In addition, the number of types of input parameters that can be changed at once among the ten types of input parameters is set to Dc. The number of search conditions Ns is obtained from Formula (1.3) using a sign C of a combination logic.

[Formula 1]

$$Ns = 1 + \sum_{i=1}^{Dc} (A-1)^i_{Da} C_i \quad (1.3)$$

It is possible to decrease the number of search conditions Ns by limiting the input parameters that can be changed at once. For example, the number of search conditions Ns is obtained such that Ns=21 when the number Dc of types of input parameters that can be changed is set such that Dc=1. Similarly, it is possible to decrease Ns to be Ns=201 when Dc is set such that Dc=2. Further, it is also possible to combine a method of designating the division area estimated to have the solution with several types of input parameters among all types of input parameters and a method of designating types of parameters that can be changed at once.

The unstable operation detection system 263 detects a case where the semiconductor processing apparatus 201 can continue a processing operation but the processing is unstable at the time of executing the search. The setting error detection system 223 confirms whether it is possible to input the input parameter in a stage before executing the input of the input parameter. However, the medium and parts serving as objects to be controlled by the devices inside the semiconductor processing apparatus 201 have the non-linearity, and the processing is executed by combining the medium and the parts. Accordingly, there is a possibility that the setting error detection system 223 fails to detect the setting error (inability of the input of the input parameter) and an input parameter, which causes the unstable operation for the first time at the time of actually executing the processing is found.

In addition, the apparatus parameter space increases as the number of input parameters increases. Thus, when an unstable operation area is locally present in the apparatus parameter space, the possibility of failing in detection of such an area in advance becomes high.

Accordingly, when the unstable operation detection system 263 has detected an unstable operation of the semiconductor processing apparatus 201 during the processing of the semiconductor processing apparatus 201, the semiconductor processing apparatus 201 saves an input parameter and a value thereof at the time of the unstable operation, and further, reports the result to the engineer or the upper-level system to which the semiconductor processing apparatus 201 is connected. Accordingly, it is possible to determine or predict an operation failure in the processing and search caused by the unstable operation of the semiconductor processing apparatus 201.

When the unstable operation has been detected, a sequence for restoration of the semiconductor processing apparatus 201 to a normal operation state is executed after completing the processing, or the processing is immediately stopped and the sequence for restoration of the semiconductor processing apparatus 201 to the normal operation state is executed to continue the search.

Examples of the unstable operation include abnormal discharge locally caused during the processing, oscillation of discharge intensity, a rapid variation of film forming speed and a variation of film quality, oscillation of gas pressure, instantaneous increase or decrease and oscillation of input power, and the like. The unstable operation is detected by the above-described monitors capable of performing the measurement in real-time and during the processing directly at the processing site, such as the emission spectrum monitor, the sediment monitor, the mass spectrometry monitor, the electrical characteristics monitor, and the pressure monitor.

Hardware Configuration Example of Search Apparatus

Figure 3:
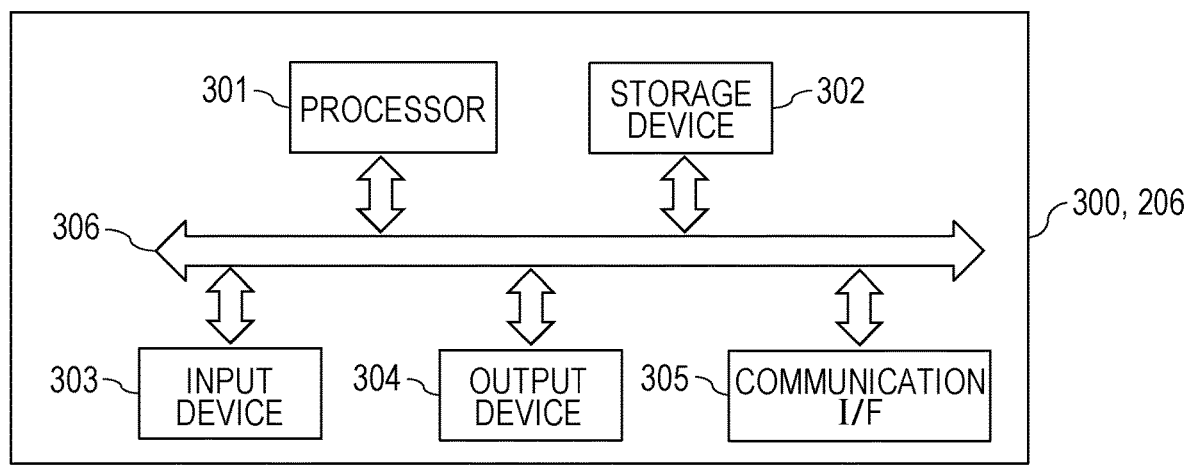
FIG. 3 is a block diagram illustrating a hardware configuration example of a search apparatus.

FIG. 3 is a block diagram illustrating a hardware configuration example of a search apparatus 300. The search apparatus 300 searches a value of an input parameter serving as a solution from a search area. The automatic control system 206 is an example of the search apparatus 300. The search apparatus 300 includes a processor 301, a storage device 302, an input device 303, an output device 304, and a communication interface (communication IF 305). The processor 301, the storage device 302, the input device 303, the output device 304, and the communication IF 305 are connected via a bus. The processor 301 controls the search apparatus 300. The storage device 302 serves as a work area of the processor 301. In addition, the storage device 302 is a non-transitory or transitory recording medium that stores various types of programs and data. Examples of the storage device 302 include a read only memory (ROM), a random access memory (RAM), a hard disk drive (HDD), and a flash memory. The input device 303 inputs data. Examples of the input device 303 include a keyboard, a mouse, a touch panel, a numeric keypad, and a scanner. The output device 304 outputs data. Examples of the output device 304 include a display and a printer. The communication IF 305 is connected to a network to perform transmission and reception of data.

Mechanical Configuration Example of Search Apparatus 300

Figure 4:
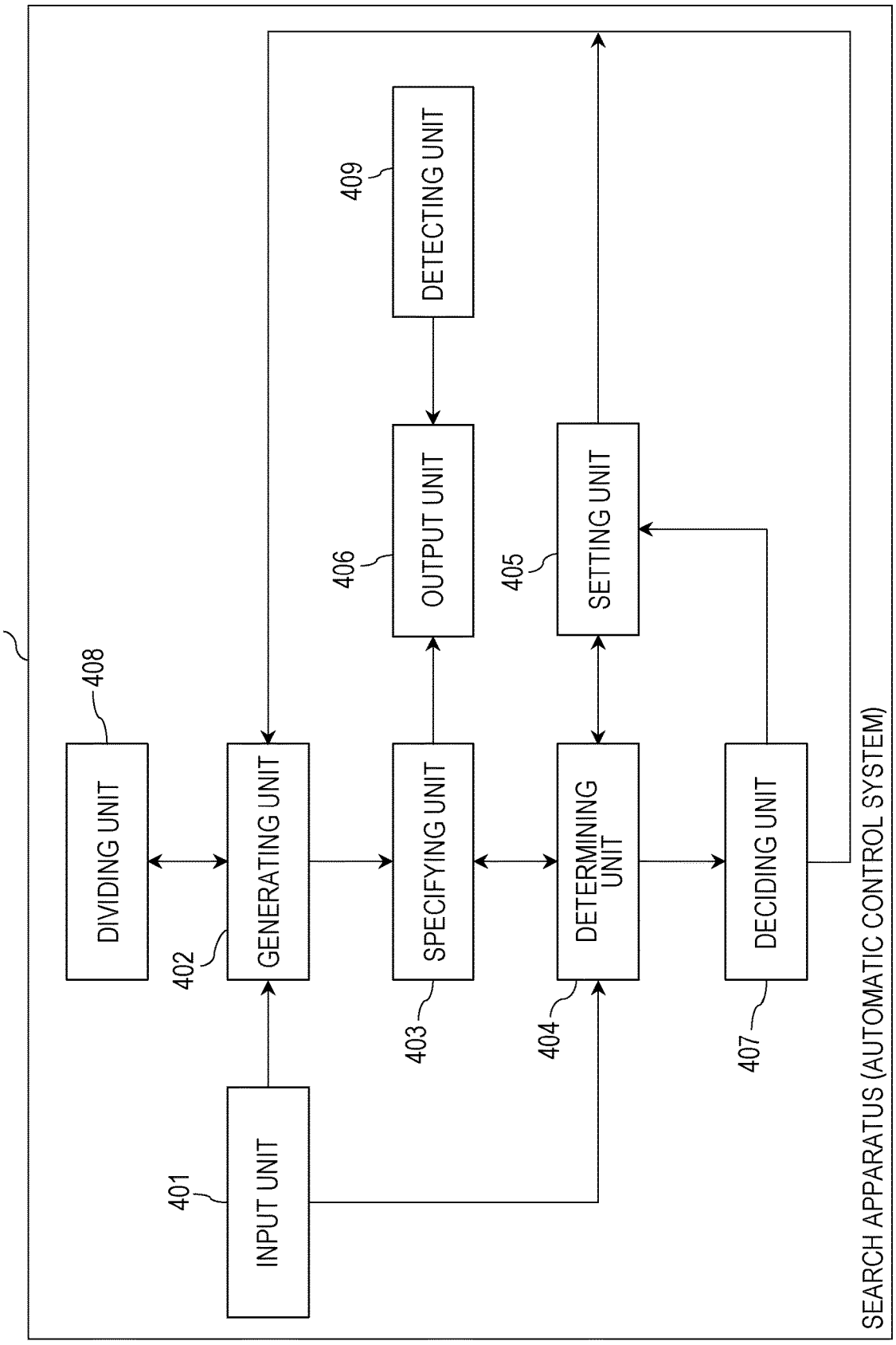
FIG. 4 is a block diagram illustrating a functional configuration example of the search apparatus.

FIG. 4 is a block diagram illustrating a functional configuration example of the search apparatus 300. The search apparatus 300 includes an input unit 401, a generating unit 402, a specifying unit 403, a determining unit 404, a setting unit 405, an output unit 406, a deciding unit 407, a dividing unit 408, and a detecting unit 409. To be specific, the respective configurations 401 to 409 are functions that are implemented by causing the processor 301 to execute the program stored in the storage device 302 illustrated in FIG. 3, for example.

The input unit 401 receives an input of the various types of data through a user operation or reading from the database 205. To be specific, for example, the input unit 401 receives an input of a condition value to be set to the semiconductor processing apparatus 201 that processes the semiconductor device. The condition to be set to the semiconductor processing apparatus 201 means the above-described input parameter. To be specific, examples of the input parameter include a gas type, a gas flow rate, pressure, input power, a voltage, a current, processing time, heating temperature, cooling temperature, a dose amount, and a light amount.

In addition, the input unit 401 receives an input of a target value which indicates a result obtained by processing a semiconductor using the semiconductor processing apparatus 201. The result obtained by processing of the semiconductor using the semiconductor processing apparatus 201 means the above-described output parameter. To be specific, examples of the output parameter include the processing result of the semiconductor using the semiconductor processing apparatus 201 and the data relating to the apparatus state of the semiconductor processing apparatus 201. To be specific, examples of the processing result of the semiconductor using the semiconductor processing apparatus 201 include a critical dimension (CD), a deposited film thickness, an etch rate (ER), a processing shape, a mask selection ratio, and wafer in-plane distribution and uniformity thereof. To be specific, examples of the processing result of the semiconductor processing apparatus 201 and the data relating to the apparatus state of the semiconductor processing apparatus 201 include a light reflection spectrum, a plasma light spectrum, a wafer incident current, a wafer voltage, wafer temperature, apparatus part temperature, and data (the sensor data and the monitor data) indicating spatial distribution and uniformity of these data. The target value, which indicates the result obtained by processing the semiconductor using the semiconductor processing apparatus 201, is a value of the output parameter of the semiconductor processing apparatus 201 requested by the user.

In addition, the input unit 401 receives an input of a reference value of the condition inside a search area defined by ranges of the condition (input parameter) and the result (output parameter). The search area is an area that is defined by the control range of the input parameter and the control range of the output parameter of the semiconductor processing apparatus 201 to search a value of the input parameter. To be specific, an example of the search area is a search area A illustrated in FIG. 1. The condition reference value is a reference value of the input parameter. To be specific, an example the condition reference value is a value of the input parameter obtained in the past.

In addition, the input unit 401 receives an input of a reference value of a result inside the search area. The result reference value is a value of the output parameter of the semiconductor processing apparatus 201 when the reference value of the input parameter is applied to the semiconductor processing apparatus 201.

The generating unit 402 generates a prediction model which indicates a relation between the condition and the result based on a setting value of the condition inside the search area and a measured value of the result at the time of applying the setting value to the semiconductor processing apparatus 201. The condition setting value is, for example, a value of the input parameter prepared as the learning data. The measured value of the result is a value of the output parameter of the semiconductor processing apparatus 201 in a case where the value of the input parameter (the condition setting value) prepared as the learning data is applied to the semiconductor processing apparatus 201. The prediction model is a function which shows a relation between the input parameter and the output parameter. The generating unit 402 generates the prediction model indicating the relation between the condition setting value inside the search area and the measured value of the output by performing regression analysis capable of corresponding to multiple inputs and multiple outputs of a neural network, a support vector machine or the like, and statistical analysis such as correlation analysis, principal component analysis, and multiple regression analysis.

The specifying unit 403 acquires a prediction value corresponding to the target value and specifies an area where the prediction value is present by applying the target value input by the input unit 401 to the prediction model generated by the generating unit 402. In addition, when the output parameter of the prediction value presence area is not acquired, the generating unit 402 acquires the measured value of the output in the case of applying the condition setting value inside the division area to the semiconductor processing apparatus 201, for each division area.

When the target value is the value of the output parameter of the semiconductor processing apparatus 201, the specifying unit 403 applies the value of the output parameter to the prediction model and acquires the value of the input parameter from the prediction model as the prediction value corresponding to the target value. Further, the specifying unit 403 specifies the value of an input parameter presence area as the prediction value from the search area. To be specific, when the target value is a value y12 of the output parameter in FIG. 1, for example, the prediction value corresponding to the target value y12 is values of the input parameters X1 and X2 which are specified by the contour line of the target value y12 in FIG. 1. Accordingly, the specifying unit 403 specifies areas A1, A2, A3, A8 and A9 where the values of the input parameters X1 and X2, specified by the contour line of the target value y12, are present from the search area A.

The determining unit 404 determines whether a target value corresponding to the prediction value is closer to the target value than the result reference value input by the input unit 401. To be specific, for example, the determining unit 404 obtains a distance (first distance) between the target value corresponding to the prediction value and the target value, and a distance (second distance) between the result reference value and the target value in the search area A. The distance is, for example, Euclidean distance. When the first distance is shorter than the second distance, the determining unit 404 determines that the target value corresponding to the prediction value is closer to the target value than the result reference value. When the first distance is not shorter than the second distance, the determining unit 404 determines that the target value corresponding to the prediction value is not closer to the target value than the result reference value.

When the determining unit 404 determines that the target value corresponding to the prediction value is closer to the target value than the result reference value, the setting unit 405 sets the prediction value and the target value corresponding to the prediction value as the condition reference value and the result reference value, and sets the prediction value presence area specified by the specifying unit 403 as the search area. Accordingly, the reference value is close to the target value, and the search area is also narrowed down to the prediction value presence area.

The output unit 406 outputs a prediction value that satisfies an achievement condition when the prediction value satisfies the achievement condition of the target value. The achievement condition is, for example, an allowable range of the target value. The output unit 406 may display the prediction value satisfying the achievement condition on the display as an example of the output device 304, transmit the prediction value to an external apparatus via the communication IF 305, or save the prediction value in the storage device 302 or the database 205.

When the determining unit 404 determines that the target value corresponding to the prediction value is not closer to the target value than the result reference value, the deciding unit 407 decides the prediction value and the target value corresponding to the prediction value as exclusion data (which will be described later in step S601 in FIG. 6). The exclusion data is a value of the input parameter that is prevented from being applied to the prediction model.

In this case, the setting unit 405 further sets data except for the exclusion data decided by the deciding unit 407 as the learning data. Accordingly, the generating unit 402 can use the learning data without the exclusion data. Accordingly, it is possible to achieve the improvement in speed of searching the value of the input parameter serving as the solution.

In addition, when the determining unit 404 determines that the target value corresponding to the prediction value is not closer to the target value than the result reference value, the deciding unit 407 may decide the prediction value presence area as the exclusion area (which will be described later in step S602 in FIG. 6). The exclusion area is an area of the input parameter that is prevented from being output by the prediction model.

In this case, the setting unit 405 further sets a remaining area, obtained by excluding the exclusion area decided by the deciding unit 407 from the search area, as the search area. Accordingly, it is possible to narrow down the search area by excluding a range of the prediction value with which only the result that is not close to the target value is obtained. Accordingly, it is possible to achieve the improvement in speed of searching the value of the input parameter serving as the solution.

The dividing unit 408 divides the search area into a plurality of areas. To be specific, the dividing unit 408 divides the search area A into nine areas (division areas) A1 to A9 as illustrated in FIG. 1, for example. In this case, the generating unit 402 acquires the measured value of the output in the case of applying the condition setting value inside the division area to the semiconductor processing apparatus 201, for each division area. Further, the generating unit 402 generates the prediction model based on the condition setting value and the measured value of the output in each divided region. When the plurality of semiconductor processing apparatuses 201 are used, it is possible to acquire the measured value for each of the division areas, and to improve a rate of generating the prediction model.

In addition, when the determining unit 404 determines that the target value corresponding to the prediction value is not closer to the target value than the result reference value, the setting unit 405 may set the prediction value presence area as the search area instead of setting the prediction value and the target value corresponding to the prediction value as the condition reference value and the result reference value (which will be described later in steps S604 to S606 in FIG. 6). Accordingly, it is possible to execute the more detailed search of the solution and to confirm whether there is no missing solution by further subdividing the search area.

In addition, when the determining unit 404 determines that the target value corresponding to the prediction value is not closer to the target value than the reference value of the result, the deciding unit 407 may decide the prediction value and the target value corresponding to the prediction value as the exclusion data as described above. In this case, the generating unit 402 may generate a prediction model based on a remaining measured value, obtained by excluding the exclusion data from the measured value, and a remaining setting value obtained by excluding a setting value corresponding to the remaining measured value from the setting value (to be described later in FIG. 7). Accordingly, it is possible to achieve the improvement in speed of searching the value of the input parameter serving as the solution.

In addition, when the determining unit 404 determines that the target value corresponding to the prediction value is not closer to the target value than the result reference value, the deciding unit 407 may decide the prediction value presence area as the exclusion area as described above. In this case, the generating unit 402 may generate a prediction model based on a remaining condition setting value inside the search area obtained by excluding the exclusion area from the search area and a measured value of the output at the time of applying this setting value to the semiconductor processing apparatus 201 (to be described later in FIG. 8). Accordingly, it is possible to achieve the improvement in speed of searching the value of the input parameter serving as the solution.

The detecting unit 409 detects an unstable operation of the semiconductor processing apparatus 201 based on the output of the semiconductor processing apparatus 201 and a predetermined output threshold value. The detecting unit 409 corresponds to the unstable operation detection system 263. In this case, the output unit 406 outputs a result obtained by detection using the detecting unit 409.

Procedure Example of Control Process of
Semiconductor Processing Apparatus 201

Figure 5:
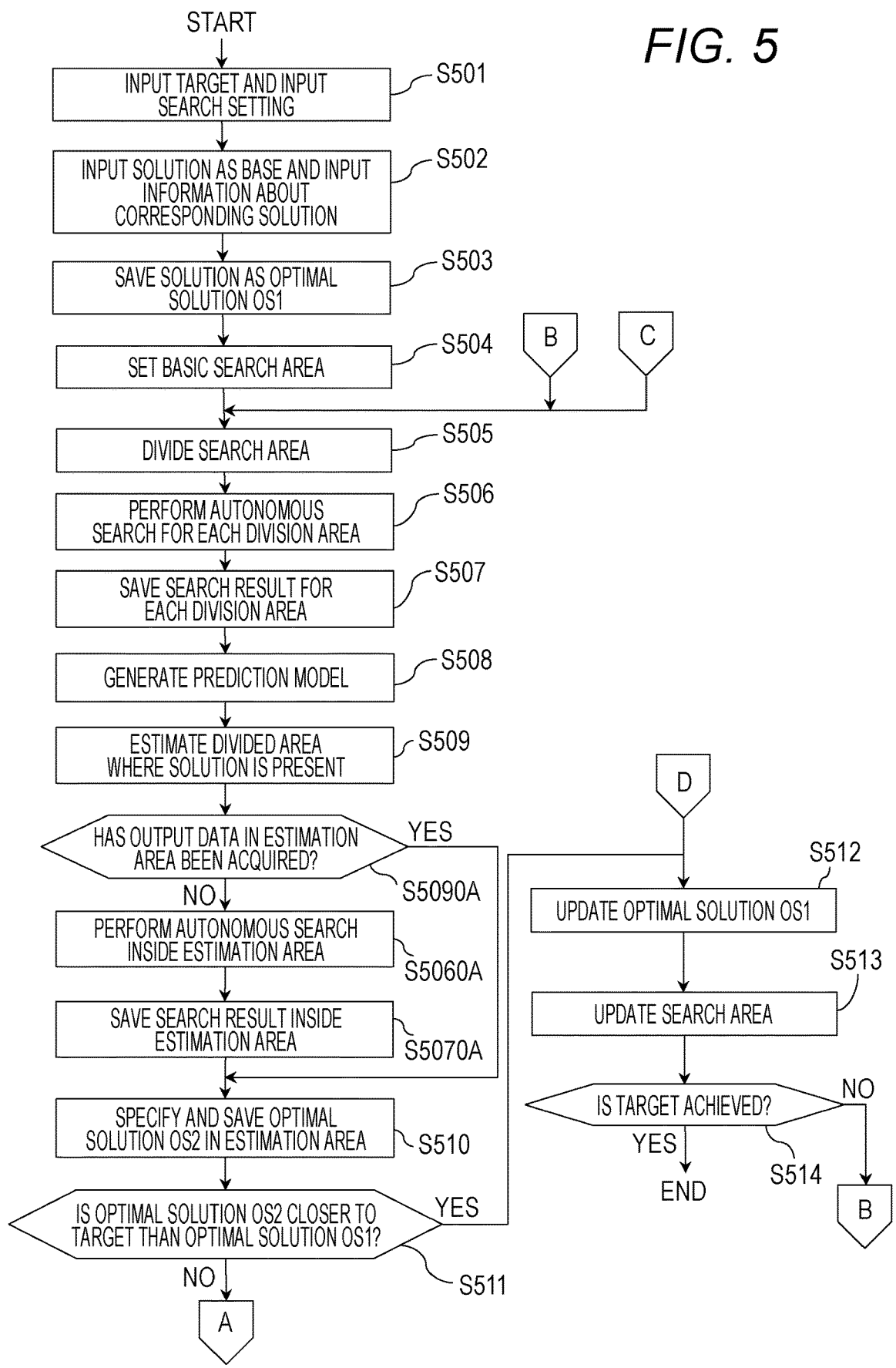
FIG. 5 is a first flowchart illustrating a procedure example of a control process of a semiconductor processing apparatus.

FIG. 5 is a first flowchart illustrating a procedure example of a control process of the semiconductor processing apparatus 201. The search apparatus 300 receives an output value from the semiconductor processing apparatus 201 as a target (target value of the output parameter), and an input of search setting (step S501). Examples of the search setting include a difference between a search result and a target value or an allowable value of divergence, an upper limit of time to execute one condition in search, the number of times of search, an upper limit of the total time taken for one set of search, an upper limit of the total time taken for the entire search, an upper limit of time for analysis of a search result, an upper limit of the number of analysis data, a threshold value of an acquisition frequency of output data from the semiconductor processing apparatus 201, an upper limit of acquisition time of output data (value of the output parameter) from the semiconductor processing apparatus 201, and a lower limit of the number of output data from the semiconductor processing apparatus 201.

Next, the search apparatus 300 receives an input of a solution as a base and an input of information on the solution (step S502). To be specific, for example, the search apparatus 300 receives an input of an input parameter that has been actually used in the past, an output parameter at the time of using the input parameter, an optimal solution (value of an input parameter) before starting search and an output parameter at the time of using the optimal solution, a target value of an output parameter before starting search, and a model function that describes a relation between an input parameter and an output parameter.

Next, the search apparatus 300 saves the optimal solution input in step S502 as an optimal solution OS1 (step S503). When there is no solution, a sign or a value indicating that it is the farthest from the solution is set.

Next, the search apparatus 300 sets a basic search area as a search area (step S504). To be specific, for example, the search apparatus 300 sets the availability of search with respect to the respective input parameters and sets an upper limit value and a lower limit value of a control range of the input parameter to search and values (for example, an upper limit value and a lower limit value) to limit the control range of the input parameter to search. In addition, the search apparatus 300 decides the search area with reference to the control range of the input parameter determined as the setting error by the setting error detection system 223. Further, the search apparatus 300 decides the search area with reference to the parameter detected by the unstable operation detection system 263. In addition, the unstable operation detection system 263 holds values of combinations of the input parameters causing stop or instability of the operation of the semiconductor processing apparatus 201 in the past or each input parameter range, and the search apparatus 300 decides the search area using these values.

For example, when the two input parameters X1 and X2 are selected as types of the input parameters in FIG. 1, the area A in the entire range illustrated in FIG. 1 is set as the search area if a control range of the input parameter X1 is set to [x11, x1$n$] and a control range of the input parameter X2 is set to [x21, x2$n$].

Input and setting content of the target setting controller 261 in steps S501 to S504 are handed over to the autonomous search system 262, and the automatic search is executed by procedures in steps S505 to S510 to be described as follow.

The search apparatus 300 divides the search area (step S505). To be specific, for example, the search apparatus 300 divides the control range of the input parameter that can be searched into two or more areas with respect to one or more input parameters. The divided area is referred to as the division area. When the number of search conditions increases and it is predicted that search is hardly completed within a desired time, it is possible to limit the search area or reduce the number of search conditions using a method of designating a division area which is estimated to have a solution in several input parameters among the types of the input parameters, and a method of designating types of the input parameters that can be changed at once. In addition, it is possible to limit the search area or reduce the number of search conditions by combining these two methods.

For example, when the two input parameters X1 and X2 are selected as types of the input parameters in FIG. 1, the nine division areas A1 to A9 illustrated in FIG. 1 are obtained if the control range [x11, x1$n$] of the input parameter X1 is divided into x1$a$, x1$b$, and x1$c$ and the control range [x21, x2$n$] of the input parameter X2 is divided into x2$a$, x2$b$, and x2$c$.

The search apparatus 300 executes autonomous search for each division area (step S506). To be specific, for example, the search apparatus 300 acquires the input and output data of the semiconductor processing apparatus 201 in each search condition as a search result through the autonomous search using the division areas and the search conditions. The input and output data is a set of a value (input data) of an input parameter assigned to the semiconductor processing apparatus 201 and a value (output data) of an output parameter obtained from the semiconductor processing apparatus 201.

To be specific, for example, the search apparatus 300 selects the value of the input parameter satisfying the search condition for each division area, and assigns the selected value of the input parameter to the semiconductor processing apparatus 201. Further, the search apparatus 300 acquires the output data (value of the output parameter) from the semiconductor processing apparatus 201. This combination of the value of the input parameter and the value of the output parameter corresponding to the value is the search result.

In this case, the unstable operation detection system 263 further detects a case where the processing operation of the semiconductor processing apparatus 201 can be continued but the processing of the semiconductor processing apparatus 201 becomes unstable during the execution of the autonomous search. When the unstable operation has been detected, the sequence for restoration of the semiconductor processing apparatus 201 to the normal operation state is executed after completing the processing, or the processing is immediately stopped and the sequence for restoration of the semiconductor processing apparatus 201 to the normal operation state is executed to continue the autonomous search performed by the target setting controller 261.

The search apparatus 300 saves the search result for each the division area in the database 205 (step S507). To be specific, for example, the search apparatus 300 saves the input and output data, which is a set of a value of an input parameter used in the autonomous search (step S506), a value of an output parameter of the semiconductor processing apparatus 201 acquired using the value of the input parameter, in the database 205 as the search result for each division area.

The search apparatus 300 generates a prediction model to predict a solution (input parameter) that satisfies a target (target output) (step S508). To be specific, for example, the search apparatus 300 generates the function indicating the relation between the input and output data of the semiconductor processing apparatus 201, as the prediction model, using the learning data saved in the database 205 in step S507. It is possible to use the regression analysis capable of corresponding to multiple inputs and multiple outputs such as the neural network, the support vector regression and regression using a Kernel method as a method of analyzing the relation between the input and output data. In addition, the statistical analysis, such as the correlation analysis, the principal component analysis, and the multiple regression analysis, can be used.

In the generation of the prediction model, for example, the sensor data and the monitor data to acquire an indirect measurement value with respect to the processing result of the semiconductor processing apparatus 201 is used as the output data. There is a case where the acquisition frequency of the output data is lower than a frequency defined in the search setting or longer than the acquisition time defined in the search setting, and the number of output data that can be acquired by search becomes smaller than the number of output data defined in the search setting. In this case, the sensor data and the monitor data with which the larger number of data can be acquired than the number of acquired output data may be acquired. Accordingly, it is possible to analyze a relation of the sensor data and the monitor data with respect to the output data, and a relation of the input data with respect to the sensor data and the monitor data. In addition, it is possible to obtain the relation of the input data with respect to the output data using these both analysis results.

The search apparatus 300 estimates the division area where the solution is present (step S509). When the output data inside the area estimated to have the solution has been acquired (Yes in step S5090A), the search apparatus 300 specifies an optimal solution OS2 in the estimation division area, and saves the estimated optimal solution OS2 in the database 205 (step S510). In addition, when the output data inside the area estimated to have the solution has not been acquired (No in step S5090A), the search apparatus 300 executes autonomous search inside the estimated area (step S5060A), acquires the output data, that is, the search result inside the area estimated to have the solution, and saves the acquired data in the database 205 (step S5070A). The autonomous search and the saving of the result are the same processes as those in steps S506 and S507. There are two methods of processing step S509. One is a method (first estimation method) of assigning the target value of the output parameter assigned in step S501 to the prediction model.

To be specific, for example, the search apparatus 300 estimates the input data (value of the input parameter) which serves as the solution satisfying the target value of the output parameter by substituting the prediction model obtained in step S508 with the target value of the output parameter assigned in step S501 in the first estimation method. Further, the search apparatus 300 specifies the division area where the input data serving as the solution is present. For example, when the prediction model is the function indicating the input and output relation of FIG. 1, the three division areas A1, A4 and A7 are estimated as the division area where the solution is present among the division areas A1 to A9 if y6 is assigned as the target value of the output parameter. When the output data is not acquired in the respective division areas A1, A4 and A7, steps S5060A and S5070A are executed as described above.

In step S510, the search apparatus 300 specifies a division area where output data equal to the target value y6 is present from the acquired output data, a division area where output data having a difference or divergence between the output data and the target value that is smaller than the allowable value (allowable value assigned in S501) is present, or a division area where output data which is the closest to the target value y6, and decides this division area as an area (hereinafter, referred to as a specified division area) where the optimal solution OS2 is present. When a plurality of division areas that can become the specified division area are specified, the search apparatus 300 decides all these areas as the division area where the optimal solution OS2 is present. Alternatively, the search apparatus 300 decides a division area having the largest number of acquired output data, which has the difference or divergence between the output data and the target value that is smaller than the allowable value (allowable value assigned in 5501) as the division area where the optimal solution OS2 is present, among the plurality of division areas. In the above-described example, when the acquired output data is the same as that in FIG. 1 indicated by the prediction model, the division areas A1, A4, and A7 or the division area A4 with which the value equal to y6 the value close to y6 has been obtained is decided as the specified division area. The search apparatus 300 decides the value of the input parameter at the time of obtaining the output data that is equal to the target value of the output parameter in the specified division area, has the difference or divergence between the output data and the target value that is smaller than the allowable value (allowable value assigned in S501), or is the closest to the target value, as the optimal solution OS2.

Another method of processing step S509 is a method that can be applied when it is difficult to directly obtain the input parameter serving as the solution satisfying the target value of the output parameter by substituting the prediction model by the target value of the output parameter assigned in step S501 (a second estimation method). The second estimation method is a method of assigning multiple sets of input parameters to the prediction model using input parameters that are assigned to the prediction model at once as one set, calculating an estimated output parameter, and acquiring a set of input parameters with which a result that is the closest to the target output is obtained. For example, the search apparatus 300 creates one or more sets of input parameters for each division area so as to be included in each division area, and assigns these sets to the prediction model, thereby calculating an output parameter at this time. It is possible to use a value serving as a central coordinate inside the division area as the set of input parameters included in the division area as a method of obtaining the representative estimation output for each division area.

When the calculation time becomes enormous in the case of calculating the estimation output by assigning extremely multiple sets of input parameters to the prediction model, the search apparatus 300 can suppress the calculation time by deciding the center condition of the input parameter to be assigned to the prediction model and limiting the types of input parameters that can be changed from the center condition as described using the above-described Formulas (1.1) to (1.3). In addition, it is possible to suppress the calculation time by limiting the number of parameter that can be changed from the center condition at once. Accordingly, the search apparatus 300 can obtain the input parameter with which the result closer to the target output can be obtained while reducing the number of sets of input parameters to be assigned to the prediction model. It is possible to use the past search result or the knowledge of the engineer at the time of setting the center condition. Alternatively, it is possible to set a central coordinate of the entire search area as the center condition.

To be specific, the search apparatus 300 can acquire the value of the output parameter which serves as the prediction value by substituting the prediction model obtained in step S508 by the value of the set of input parameters in the second estimation method. For example, when the prediction model is the function indicating the input and output relation illustrated in FIG. 1, it is possible to obtain the estimated output parameter corresponding to each input parameter when (x11, x21), (x11, x22), (x11, x23), (x12, x21), (x12, x22), (x12, x23), (x13, x21), (x13, x22), (x13, x23), (x1$n$, x21), (x1$n$, x22) and (x1$n$, x23) are assigned to the prediction model as the value of the input parameter.

In addition, when the output parameters corresponding to these respective input parameters have not been acquired (Yes in step S5090A), the search apparatus 300 executes the autonomous search using the respective input parameters (step S5060A), acquires the output data, that is, the search result inside the area estimated to have the solution, and saves the acquired data in the database 205 (step S5070A). The autonomous search and the saving of the result are the same processes as those in steps S506 and S507. In addition, the process transitions to step S510 when the output parameters corresponding to the respective input parameters have been acquired (No in step S5090A).

Further, the search apparatus 300 decides the value of the input parameter with which the value of the output parameter serving as the prediction value that is closest to the target value of the output parameter in the division area, for example, as the optimal solution OS2 in step S510. For example, when the acquired output data is the same as that of FIG. 1 indicated by the prediction model, a value y10 of the output parameter corresponding to the value (x13, x23) of the input parameter becomes the closest value in a case where the target value of the output parameter is y10. Accordingly, the optimal solution OS2 becomes (x13, x23). Incidentally, any of the first estimation method and the second estimation method to be applied is set in advance.

The search apparatus 300 determines whether the value of the optimal solution OS2 is a solution that can obtain an output parameter closer to a target than that obtained using the value of the optimal solution OS1 (step S511). Further, when the value of the optimal solution OS2 is the solution that can obtain the output parameter closer to the target than that obtained using the value of the optimal solution OS1 (Yes in step S511), the process transitions to step S512. In the opposite case (No in step S511), the process transitions to step S601 (FIG. 6).

In the case of Yes in step S511, the search apparatus 300 updates the optimal solution OS1 by setting the optimal solution OS2 as the optimal solution OS1 (step S512). In addition, the search apparatus 300 updates the search area by setting the division area of the updated optimal solution OS1 as the search area (step S514).

Thereafter, the search apparatus 300 determines whether the target has been achieved (step S514). When the target has been achieved (Yes in step S514), the search apparatus 300 ends the control process. On the contrary, when the target has not been achieved (No in step S514), the process transitions to step S505 or S601 (FIG. 6). Any of step S505 and S601 (FIG. 6) to which the process transitions may be set in advance or may be selected by the user each time. Incidentally, when the target has not been achieved (No in step S514) and the process transitions to step S505, the search apparatus 300 divides the updated search area obtained in step S513 (step S505).

To be specific, for example, when the output parameter corresponding to the updated optimal solution OS1 is equal to the target value or has a difference from the target value that is within the allowable range in step S514, the search apparatus 300 determines that the target has been achieved (Yes in step S514). In addition, it is determined that the target has been achieved (Yes in step S514) when the search time set in step S501 has elapsed even if the output parameter corresponding to the updated optimal solution OS1 is not equal to the target value or has a difference from the target value that is not within the allowable range. On the contrary, it is determined that the target has not been achieved (No in step S514) when the output parameter corresponding to the updated optimal solution OS1 is not equal to the target value or has a difference from the target value that is not within the allowable range, and the search time set in step S501 has not elapsed.

Figure 6:
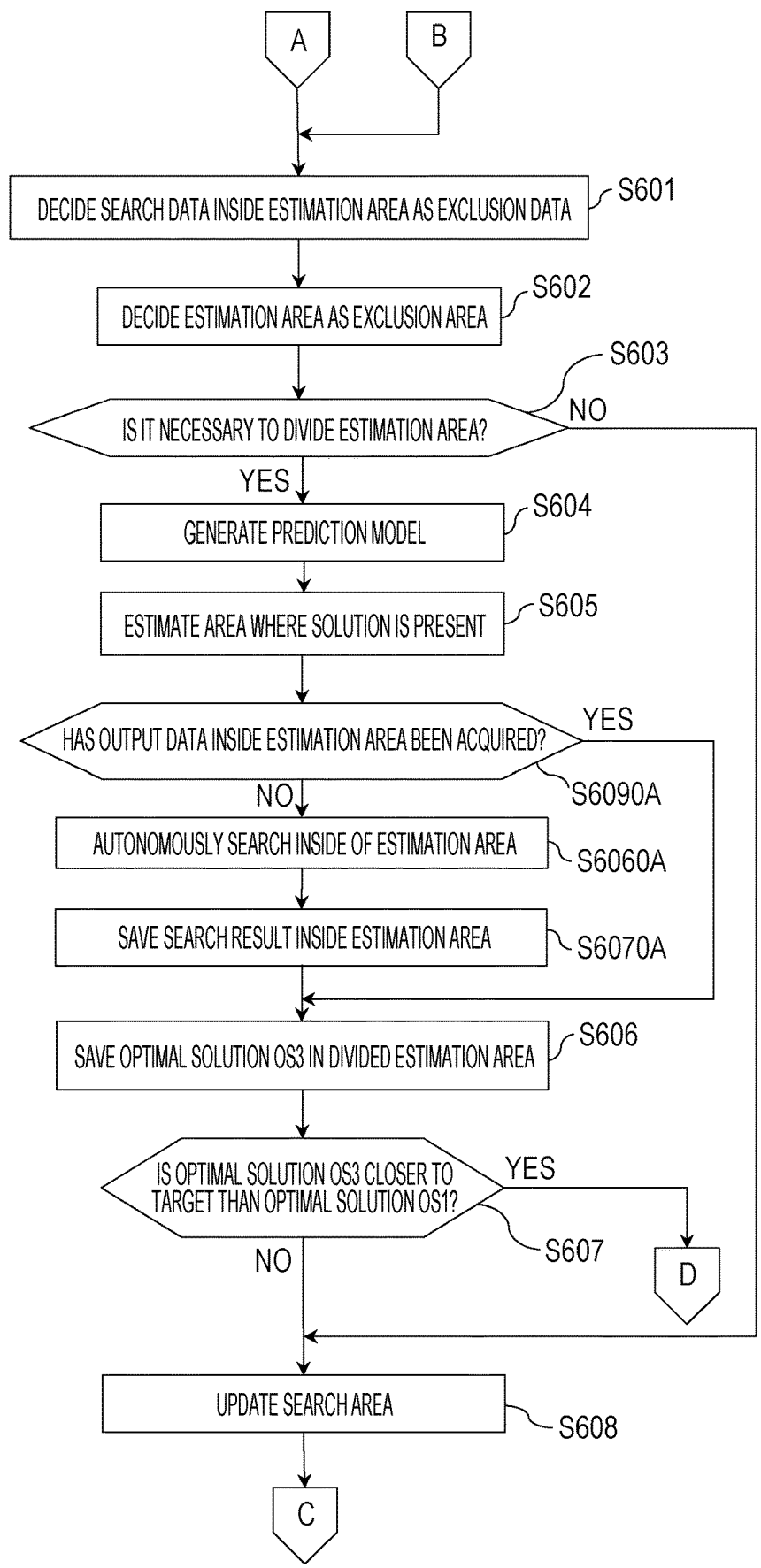
FIG. 6 is a second flowchart illustrating a procedure example of the control process of the semiconductor processing apparatus.

FIG. 6 is a second flowchart illustrating a procedure example of the control process of the semiconductor processing apparatus 201. The search apparatus 300 decides the search data inside the division area obtained in step S509 as exclusion data (step S601). To be specific, for example, the search apparatus 300 decides the input data (value of the input parameter) inside the estimated area and the output data (output parameter) as the exclusion data. The exclusion data is data having the possibility of being excluded in the current or subsequent process (exclusion from data serving as an actual analysis target is executed in S703 in FIG. 7 or S608 in FIGS. 6 to 8). Similarly, the search apparatus 300 decides the division area obtained in step S510 as an exclusion area (step S602). The exclusion area is an area having the possibility of being excluded in the current or subsequent process (exclusion from data serving as an actual analysis target is executed in S803 in FIG. 8 or S608 in FIGS. 6 to 8).

Thereafter, the search apparatus 300 determines whether to divide the division area obtained in step S509 (step S603). The process transitions to step S604 in the case of dividing the area (Yes in step S603), and transitions to step S608 in the case of not dividing the area (No in step S603).

To be specific, for example, the search apparatus 300 determines whether to divide the division area depending on presence or absence of an input of a division instruction from the user in step S603. In addition, the search apparatus 300 may forcibly divide the division area (Yes in step S603).

Thereafter, the search apparatus 300 generates the prediction model (step S604) similarly to step S508. Next, the search apparatus 300 estimates the division area where the solution is present from a division area group divided in step S603 (step S605) similarly to step S509. The estimated division area is referred to as the estimation division area. Further, the search apparatus 300 executes the same processes as those in steps S5090A, S5060A and S5070A in steps S6090A, S6060A and S6070A. To be specific, for example, when the output data inside the area estimated to have the solution has been acquired (Yes in step S6090), the search apparatus 300 specifies an optimal solution OS3 in the estimation division area, and saves the estimated optimal solution OS3 in the database 205 (step S606). In addition, when the output data inside the area estimated to have the solution has not been acquired (No in step S6090), the search apparatus 300 executes autonomous search inside the estimated area (step S6060A), acquires the output data, that is, the search result inside the area estimated to have the solution, and saves the acquired data in the database 205 (step S6070A) in the same manner.

Thereafter, the search apparatus 300 determines whether a value of the output parameter according to the optimal solution OS3 is a solution closer to the target than the value of the output parameter according to the optimal solution OS1 (step S607) similarly to step S511. Further, the process transitions to step S512 in a case where the value of the output parameter corresponding to the optimal solution OS3 is the solution closer to the target than the value of the output parameter corresponding to the optimal solution OS1 (Yes in step S607), and transitions to step S608 in the opposite case (No in step S607). In step S608, the search apparatus 300 updates the search area by excluding the exclusion area from the search area or excluding the exclusion area and the exclusion data (step S608), and the process transitions to step S505.

Figure 7:
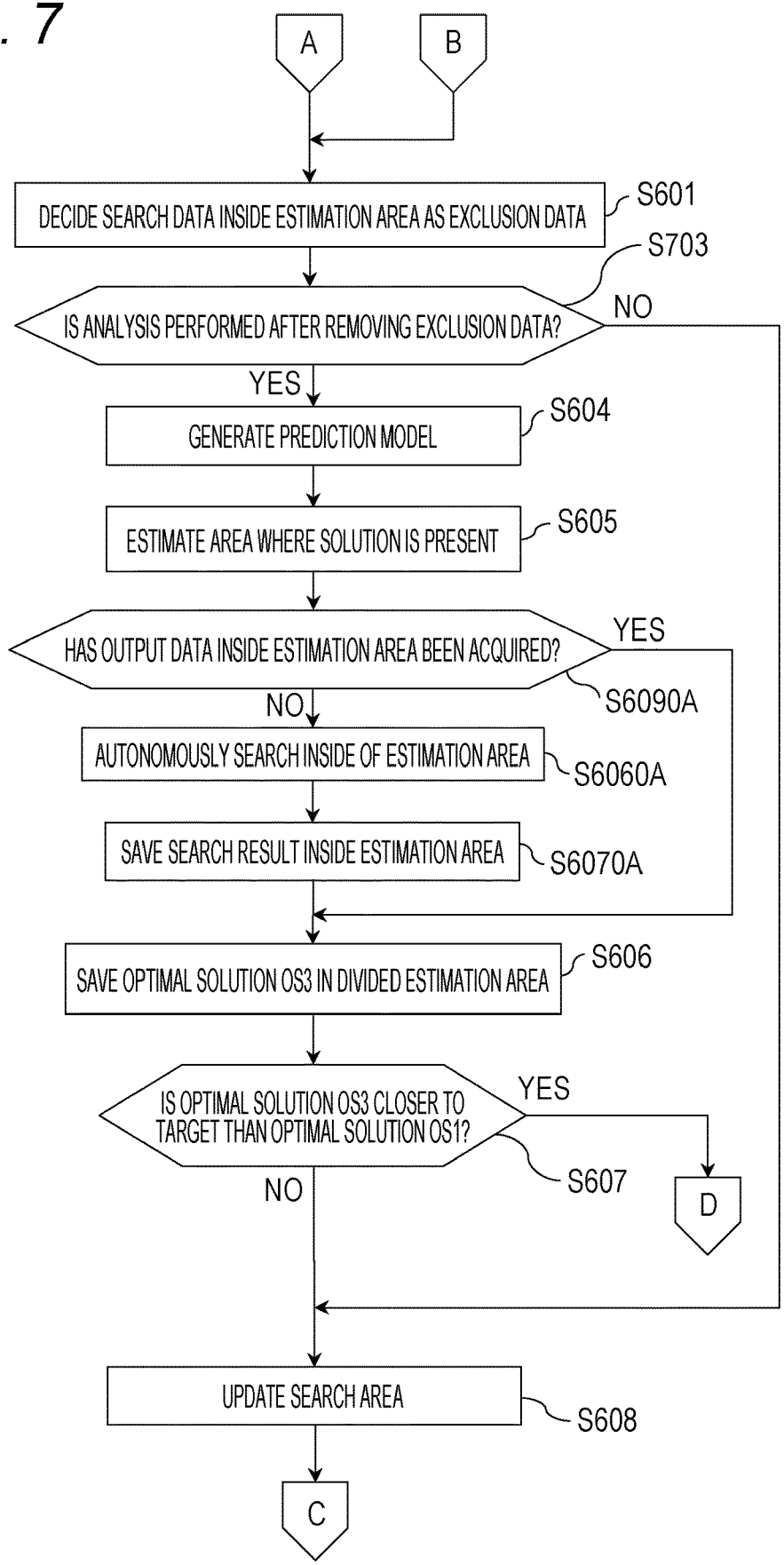
FIG. 7 is a third flowchart illustrating a procedure example of the control process of the semiconductor processing apparatus.

FIG. 7 is a third flowchart illustrating a procedure example of the control process of the semiconductor processing apparatus 201. The third flowchart is another processing example of the second flowchart illustrated in FIG. 6. Incidentally, the same process as that of FIG. 6 will be denoted by the same step number, and will not be described. After step S601, the search apparatus 300 determines whether to exclude the exclusion data decided in step S601 (step S703). The process transitions to step S604 when analysis is performed after performing the exclusion (Yes in step S703), and transitions to step S608 when the analysis is performed without performing the exclusion (No in step S703).

To be specific, for example, the search apparatus 300 determines whether to perform the analysis after excluding the exclusion area depending on presence or absence of an input of an exclusion instruction from the user in step S703. In addition, the search apparatus 300 may perform the analysis after forcibly excluding the exclusion data (Yes in step S703).

Thereafter, the search apparatus 300 generates a prediction model of the division area without using the exclusion data (step S604), and executes steps S605, S6090A, S6060A, S6070A, S606, S607, and S608.

Figure 8:
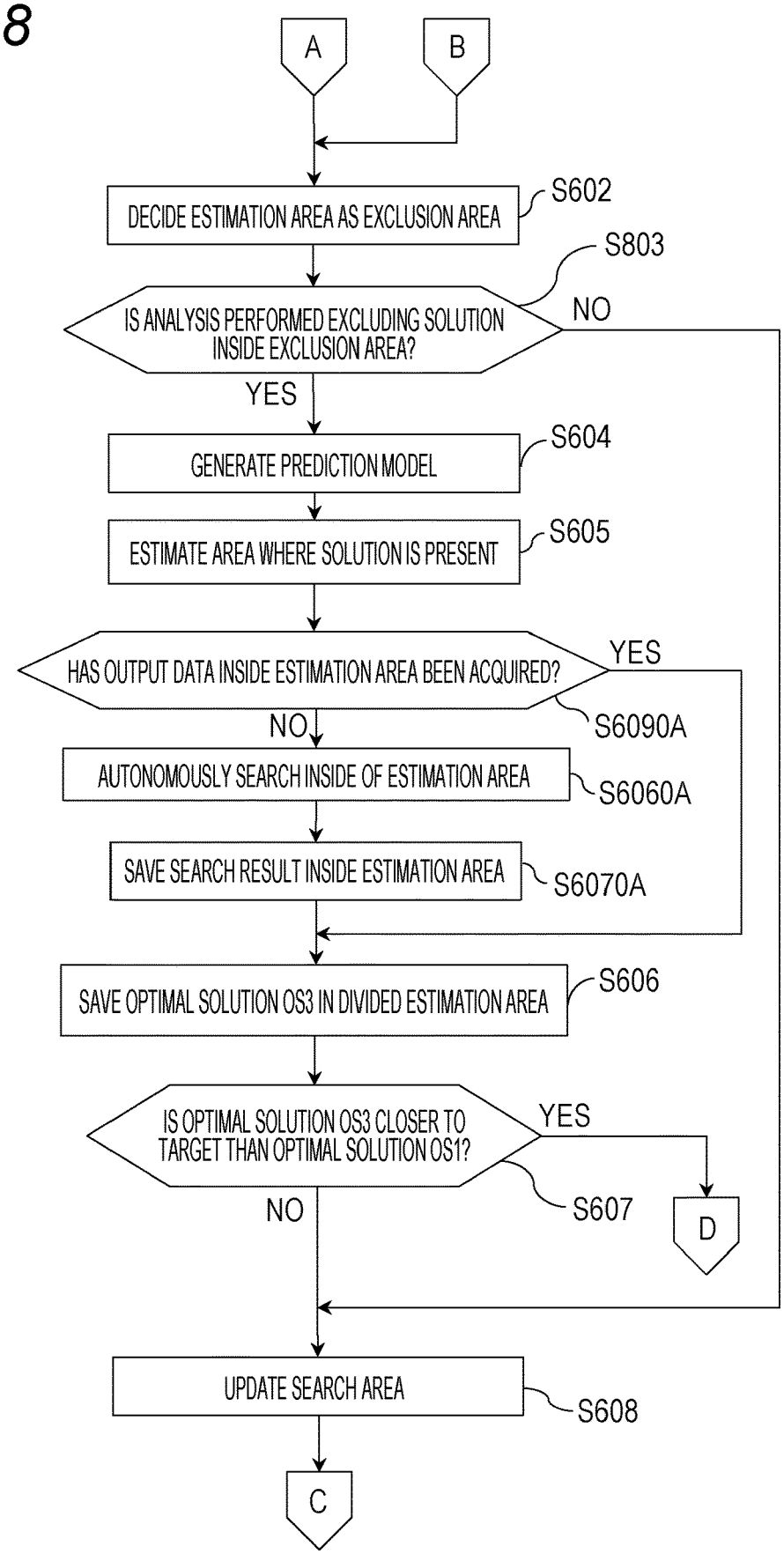
FIG. 8 is a fourth flowchart illustrating a procedure example of the control process of the semiconductor processing apparatus.

FIG. 8 is a fourth flowchart illustrating a procedure example of the control process of the semiconductor processing apparatus 201. The fourth flowchart is still another processing example of the second flowchart illustrated in FIG. 6. Incidentally, the same process as that of FIG. 6 will be denoted by the same step number, and will not be described. After step S602, the search apparatus 300 determines whether to perform the analysis after excluding the exclusion area decided in step S602 (step S803). The process transitions to step S604 when the analysis is performed after performing the exclusion (Yes in step S803), and transitions to step S608 when the analysis is performed without performing the exclusion (No in step S803).

To be specific, for example, the search apparatus 300 determines whether to perform the analysis after excluding the solution (value of the input parameter) inside the exclusion area depending on presence or absence of the input of the exclusion instruction from the user in step S803. In addition, the search apparatus 300 may perform the analysis after forcibly excluding the exclusion area (Yes in step S803).

Thereafter, the search apparatus 300 generates the prediction model of the division area (step S604) similarly to step S604. Next, the search apparatus 300 estimates the division area where the solution is present from a division area group divided in step S603 without using the solution (value of the input parameter) inside the exclusion area (step S605). The estimated division area is referred to as the estimation division area. Further, the search apparatus 300 executes steps S6090A, S6060A, S6070A, S606, S607, and S608.

Incidentally, when a scale of the analysis, saving, transmission and the like of data increases in this control process so that the execution time thereof becomes longer than the time to search one condition, it is possible to continue the search in parallel with the execution of these processes. At this time, one or more value is increased among the number of input parameters to be changed in the search condition, the number of input parameters to be changed at the same time, and the number of divisions of the search area. Accordingly, when the number of search conditions is increased and search is performed for these conditions, it is possible to increase the search results using the time for executing the analysis and the like. In particular, there is a case where the time required for the analysis of data becomes several minutes to several hours or longer, and it is possible to improve the search speed by continuing the search during the analysis.

First Application Example of Control Process of Semiconductor Processing apparatus 201

Next, a description will be given regarding an application example of the control process, performed to correct an apparatus difference of the semiconductor processing apparatus 201 in maintenance of the semiconductor processing apparatus 201 performed before mass production of the semiconductor device. Herein, the semiconductor processing apparatus 201 is assumed to be an etching apparatus that performs a discharging process as an example for describing a procedure of apparatus difference suppression. In addition, an input parameter at the time of executing the discharging process will be referred to as a recipe. In the etching apparatus that performs the discharging process, a processing result or discharging characteristics used in the processing are exemplified as output serving as an object to be corrected. A method of correcting another etching apparatus to obtain the same output as that of an etching apparatus serving as a reference or a method of performing correction such that outputs of a plurality of etching apparatuses become even is used as a correction method.

Figure 9:
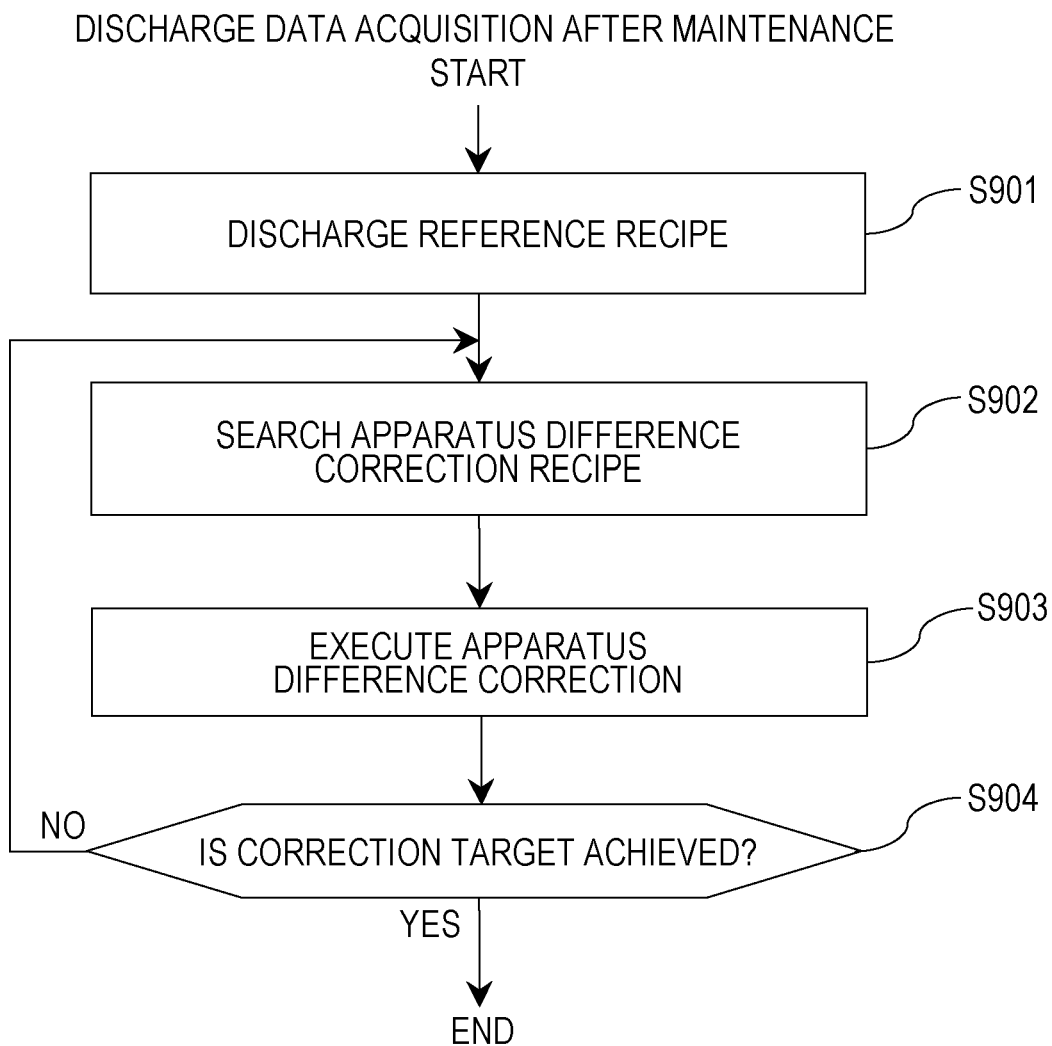
FIG. 9 is a flowchart illustrating a method of suppressing an apparatus difference.

FIG. 9 is a flowchart illustrating a method of suppressing an apparatus difference. To be specific, for example, the search apparatus 300 starts acquisition of discharge data in FIG. 9 after maintenance in order to perform the apparatus difference correction representing a procedure example of the process of maintaining the semiconductor processing apparatus 201 performed before the mass production of the semiconductor device.

First, the search apparatus 300 performs reference recipe discharging in order to perform a basic discharging process, and acquires input and output data at this time. In addition, discharging according to the recipe to be used in the mass production is performed, and output data (value of an output parameter) at this time is acquired (step S901). Step S901 is the process corresponding to steps S501 to S504.

Next, the search apparatus 300 searches an apparatus difference correction recipe (step S902). Step S902 is the process corresponding to steps S505 to S507. Further, the search apparatus 300 executes the apparatus difference correction using the apparatus difference correction recipe searched in step S902 (step S903). Step S903 is the process corresponding to steps S508 to S513 and the processes in FIGS. 6 to 8. The process returns to step S902 when a correction target has not been achieved (No in step S904), and the process is ended when the correction target has been achieved (Yes in step S904). Step S904 is the process corresponding to step S514.

Incidentally, the search speed may be improved by causing the search to proceed in parallel using a plurality of the same etching apparatuses. At this time, it is possible to enhance the possibility that the solution that satisfies the target can be searched by employing the plurality of etching apparatuses from which the apparatus difference has been corrected by the procedure in FIG. 9. Further, it is possible to perform the correction by loading the searched solution in the plurality of apparatuses.

When the search method using the search apparatus 300 is executed after the maintenance of the semiconductor processing apparatus 201 in this manner, it is possible to cause the value of the output parameter of the semiconductor processing apparatus 201 to approximate to the value of the output parameter serving as the reference (automatic apparatus difference correction function).

Second Application Example of Control Process of Semiconductor Processing Apparatus 201

Next, a description will be given regarding an application example of a control process to correct a temporal change in the mass production of the semiconductor device process.

Figure 10:
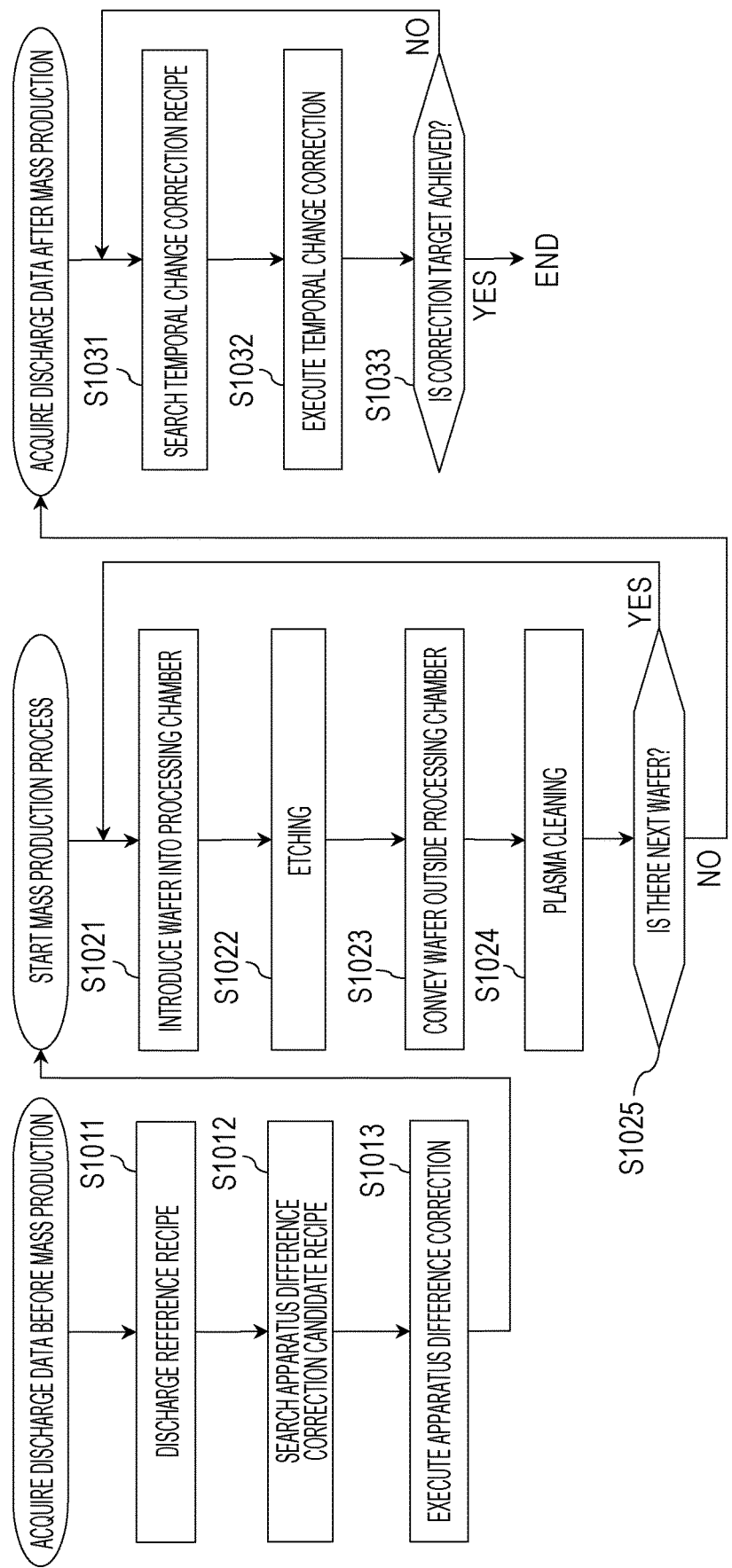
FIG. 10 is a flowchart illustrating a method of correcting a temporal change.

FIG. 10 is a flowchart illustrating a method of correcting the temporal change. In FIG. 10, the semiconductor processing apparatus 201 is assumed to be the etching apparatus that uses discharging in processing as an example for describing a procedure of correcting the semiconductor processing apparatus 201, similarly to FIG. 9. In the discharge data acquisition prior to the mass production, the search apparatus 300 first assigns a reference recipe for the basic discharging process to the etching apparatus to perform the reference recipe discharging, and acquires output data (value of the output parameter) at this time in order to perform the correction of the temporal change during the mass production (step S1011). Step S1011 is the process corresponding to steps S501 to S504.

Next, the search apparatus 300 searches an apparatus difference correction candidate recipe (step S1012). In step S1012, output data or sensor data and monitor data with which a temporal change of an object to be corrected can be predicted is used based on an analysis result of input and output data in the past mass production. Further, the search apparatus 300 executes the search of the apparatus difference correction candidate recipe to change these data with which the temporal change can be predicted to values after being subjected to temporal change in the etching apparatus prior to starting of the mass production. Step S1012 is the process corresponding to steps S505 to S507.

Next, the search apparatus 300 executes the apparatus difference correction (step S1013). In step S1013, the search apparatus 300 compares a basic recipe for mass production, used in a state where the temporal change is not generated, with the apparatus difference correction candidate recipe searched in step S1012, and confirms an input parameter changed in the apparatus difference correction candidate recipe. Accordingly, it is possible to generate a function to describe a relation between an input parameter and an output parameter of the object to be corrected in a stage prior to the mass production, and further, it is possible to generate the recipe serving as the correction candidate based on the relation. Step S1013 is the process corresponding to steps S508 to S513 and the processes in FIGS. 6 to 8. Thereafter, the mass production process is started.

When the mass production of the semiconductor device process is started after step S1013, a wafer is introduced into the processing chamber (step S1021), the etching apparatus etches the wafer (step S1022). The etching (step S1022) is configured using one step or a plurality of steps. When the etching (step S1022) includes the plurality of steps, the etching of each step is executed by changing a discharge condition. After completion of the etching (step S1022), the wafer is carried out of the processing chamber (step S1023). Further, plasma cleaning is performed to remove reaction products generated during the etching and deposited on a surface of the processing chamber (step S1024). The process returns to step S1021 when there is the next wafer (Yes in step S1025), and transitions to the discharge data acquisition after the mass production when there is no next wafer (No in step S1025).

The input and output data of the etching apparatus during the mass production are saved in the database 205, and the search apparatus 300 continues analysis of the input and output data in real-time in a parallel manner. Accordingly, it is possible to continue the estimation of the output data or the sensor data and the monitor data with which the temporal change of the object to be corrected can be predicted, during the mass production. In addition, the search apparatus 300 can increase the number of data by integrating the input and output data of the plurality of etching apparatuses that execute the same mass production process.

When the discharge data is acquired after the mass production or after elapse of time designated from start of the mass production, the search apparatus 300 executes the search of the recipe to correct the temporal change (step S1031). To be specific, for example, the search apparatus 300 uses the data acquired in steps S1011 and S1012, the relation between the analyzed input and output data, and the correction candidate recipe as the input in step S502 to search a temporal change correction recipe. Step S1031 is the process corresponding to steps S505 to S507.

Further, the search apparatus 300 uses the temporal change correction recipe serving as a search result to perform verification of a correction result (step S1032). Step S1032 is the process corresponding to steps S508 to S513 and the processes in FIGS. 6 to 8.

In addition, the search apparatus 300 may analyze the output data acquired during the mass production of the semiconductor device, estimate the output data or the sensor data and the monitor data with which the temporal change of the object to be corrected can be predicted, and execute step S1012 prior to the execution of steps S1031 and S1032. Accordingly, it is possible to generate a function for describing the relation between the input parameter and the output parameter of the object to be corrected, and further, to generate the recipe serving as the correction candidate based on the relation. The search apparatus 300 can execute steps S1031 and S1032 using these results in step S502.

Further, a recipe obtained by changing an input parameter, which is frequently used for correction, based on the knowledge of the engineer, input and output data and an analysis result thereof at the time of performing discharging using this recipe may be used as the input of step S502 in the above-described search.

Further, the process returns to step S1031 when a correction target has not been achieved (No in step S1033), and the process is ended when the correction target has been achieved (Yes in step S1033). Step S1033 is the process corresponding to step S514. At the time of executing the search illustrated in FIG. 10, it is possible to improve the search speed by causing the search to proceed in parallel using the plurality of etching apparatuses after being subjected to the mass production in which the same mass production process has been performed. Further, it is possible to execute the correction by loading the searched solution (input parameter) in the plurality of etching apparatuses that execute the same mass production process.

When the search method using the search apparatus 300 is executed after the mass production of the semiconductor in this manner, it is possible to correct the temporal change of the value of the output parameter of the semiconductor processing apparatus 201 during the mass production (automatic temporal change correction function).

In this manner, the search apparatus 300 automatically analyzes the value of the input parameter and the value of the output parameter of the semiconductor processing apparatus 201, and automatically decides the experiment condition to search the value of the input parameter on consideration of the analysis result thereof. Further, the search apparatus 300 automatically performs verification of the experiment result and can automatically search the value of the input parameter with which the apparatus state and the processing result (value of the output parameter) serving as the target can be obtained by repeating these automatic operations. Accordingly, the semiconductor processing apparatus 201 itself can automatically draw out the apparatus performance, and can support development of a control model to further drawing-out of the apparatus performance and the engineer who selects an apparatus parameter (combination of the input parameter and the output parameter).

As described above the search apparatus 300 according to the embodiment includes: the input unit 401 that receives each input of a target value, which indicates a condition to be set in a semiconductor processing apparatus 201 to process a semiconductor or a result obtained by processing the semiconductor using the semiconductor processing apparatus 201, a reference value of the condition inside a search area defined by ranges of the condition and the result, the reference value indicated by the target value; the generating unit 402 that generates a prediction model indicating a relation between the condition and the result based on a setting value of the condition inside the search area, a measured value of the result obtained when the setting value is assigned to the semiconductor processing apparatus 201; the specifying unit 403 that acquires a prediction value from the prediction model by assigning the target value input to the input unit 401 to the prediction model generated by the generating unit 402, and specifies a presence area of the prediction value from the search area; the determining unit 404 that determines whether the measured value of the result corresponding to the prediction value is closer to the target value than the reference value input to the input unit 401; the setting unit 405 that sets the prediction value to the reference value when the determining unit 404 determines that the measured value of the result corresponding to the prediction value is closer to the target value, and sets the prediction value presence area specified by the specifying unit to the search area; and the output unit 406 that outputs a prediction value satisfying an achievement condition when the measured value of the result corresponding to the prediction value satisfies the achievement condition of the target value.

Accordingly, it is possible to improve the accuracy in achieving the optimal solution that relates to the input and output of the semiconductor processing apparatus 201. Accordingly, it is possible to achieve the efficiency in operation and optimization of processing of the semiconductor processing apparatus 201.

In addition, when the determining unit 404 determines that a measured value of a result, which corresponds to a prediction value obtained using a prediction model, is not closer to a target value, the search apparatus 300 causes the deciding unit 407 to decide a prediction value inside a prediction value presence area and the measured value of the result corresponding to the prediction value as exclusion data, and causes the setting unit 405 to set a remaining area obtained by excluding an exclusion area specified using exclusion data from a search area and the target value assigned to the semiconductor processing apparatus 201 when the exclusion data is obtained, as the search area. Accordingly, it is possible to exclude the exclusion area, which has a combination of a prediction value that is not close to a target value and the target value, from the latest search area, and to achieve the improvement of the accuracy in achieving the optimal solution.

In addition, the search apparatus 300 causes the dividing unit 408 to divide the search area into a plurality of areas and causes the specifying unit 403 to set the prediction value to a reference value to specify the prediction value presence area from a plurality of division areas when the determining unit 404 detects that the measured value of the result corresponding to the prediction value is closer to the target value. Accordingly, it is possible to easily specify the prediction value presence area and to achieve the improvement of the search speed.

In addition, the search apparatus 300 causes the dividing unit 408 to divide the search area into a plurality of areas, causes the generating unit 402 to acquire the measured value of the result, obtained when the condition setting value inside a division area is assigned to the semiconductor processing apparatus 201, for each division area, and causes the generating unit 402 to generate a prediction model based on the condition setting value and the measured value of the result in each of the division areas. Accordingly, it is possible to acquire the measured value for each of the division areas, and to increase the generation rate of the prediction model using the plurality of semiconductor processing apparatuses 201.

In addition, when the determining unit 404 determines that the measured value of the result corresponding to the prediction value is not closer to the target value, the search apparatus 300 causes the deciding unit 407 to decide data acquired inside the prediction value presence area as exclusion data, causes the generating unit 402 to generate a prediction model based on a specific measured value obtained by excluding the exclusion data from the measured value and a specific setting value obtained by excluding a setting value, assigned to the semiconductor processing apparatus 201 when the exclusion data is obtained, from the setting value. In addition, it is possible to exclude the exclusion area, which has a combination of a prediction value that is not close to a target value and the setting value, from a candidate of the prediction value, and to achieve the improvement of the accuracy in the prediction model. Accordingly, it is possible to obtain a more favorable prediction value using the generated prediction model.

In addition, the search apparatus 300 causes the detecting unit 409 to detect an unstable operation of the semiconductor processing apparatus 201 based on the measured value of the result and a predetermined output threshold value, and causes the output unit 406 to output a detection result obtained by the detecting unit 409. Accordingly, it is possible to urge the user to decide whether to continue the search.

Incidentally, the present invention is not limited to the above-described embodiments, and may include various modifications and equivalent configurations within a gist of the range of the appended claims. For example, the above-described embodiments have been described in detail in order to describe the present invention in an easily understandable manner, and the present invention is not necessarily limited to one including the entire configuration that has been described above. In addition, a part of the configuration of a certain embodiment may be replaced with the configuration of another embodiment. In addition, the configuration of a certain embodiment may be added with the configuration of another embodiment. In addition, addition, deletion or substitution of other configurations may be made with respect to some configurations of each embodiment.

In addition, each configuration, function, processing unit, processing means, and the like described above may be, partially or fully, implemented by hardware, for example, by designing it using an integrated circuit and the like, or implemented by software by causing the processor to interpret and execute a program that implements each function.

The information, such as a program, a table, and a file, to implement each function can be stored in a storage device, such as a memory, a hard disk, and an SSD (Solid State Drive), or a recording medium such as an integrated circuit (IC) card, an SD card, and a digital versatile disc (DVD).

In addition, only a control line and an information line considered to be necessary for the description are illustrated, and all control lines and information lines required for implementation are not illustrated. It may be considered that most of configurations are practically connected to each other.

What is claimed is:

1. A search apparatus comprising:
    an input unit that receives each input of a target value, which indicates a condition to be set in a semiconductor processing apparatus to process a semiconductor or a result obtained by processing the semiconductor using the semiconductor processing apparatus, a reference value of the condition inside a search area defined by ranges of the condition and the result, and the result, the reference value indicated by the target value;
    a generating unit that generates a prediction model indicating a relation between the condition and the result based on a setting value of the condition inside the search area, a measured value of the result obtained when the setting value is assigned to the semiconductor processing apparatus;
    a specifying unit that acquires a prediction value from the prediction model by assigning the target value input to the input unit to the prediction model generated by the generating unit, and specifies a presence area of the prediction value from the search area;
    a determining unit that determines whether the measured value of the result corresponding to the prediction value is closer to the target value than the reference value input to the input unit;
    a setting unit that sets the prediction value to the reference value when the determining unit determines that the measured value of the result corresponding to the prediction value is closer to the target value, and sets the prediction value presence area specified by the specifying unit to the search area; and
    an output unit that outputs a prediction value satisfying an achievement condition when the measured value of the result corresponding to the prediction value satisfies the achievement condition of the target value.

2. The search apparatus according to claim 1, further comprising
    a deciding unit that decides the prediction value inside the prediction value presence area and the measured value of the result corresponding to the prediction value as exclusion data when the determining unit determines that the measured value of the result corresponding to the prediction value is not closer to the target value,
    wherein the setting unit sets a remaining area obtained by excluding an exclusion area, which is specified based on the exclusion data decided by the deciding unit and a target value assigned to the semiconductor processing apparatus when the exclusion data is obtained, from the search area as the search area.

3. The search apparatus according to claim 1, further comprising
    a dividing unit that divides the search area into a plurality of areas,
    wherein the specifying unit sets the prediction value to the reference value when the determining unit determines that the measured value of the result corresponding to the prediction value is closer to the target value, and specifies the prediction value presence area, specified by the specifying unit, among a plurality of division areas obtained by the dividing unit.

4. The search apparatus according to claim 1, further comprising
    a dividing unit that divides the search area into a plurality of areas,
    wherein the generating unit acquires the measured value of the result, obtained when the condition setting value inside the division area obtained by the dividing unit is assigned to the semiconductor processing apparatus, for each of the division areas, and generates the prediction model based on the condition setting values in the respective division areas and the measured value of the result.

5. The search apparatus according to claim 1, wherein
    the setting unit sets the prediction value presence area to the search area when the determining unit determines that the measured value of the result corresponding to the prediction value is not closer to the target value, instead of setting the prediction value to the reference value.

6. The search apparatus according to claim 1, further comprising
a deciding unit that decides the prediction value inside the prediction value presence area as exclusion data when the determining unit determines that the measured value of the result corresponding to the prediction value is not closer to the target value,
wherein the generating unit generates the prediction model based on a specific measured value obtained by excluding the exclusion data from the measured value and a specific setting value obtained by excluding a setting value, assigned to the semiconductor processing apparatus when the exclusion data is obtained, from the setting value.

7. The search apparatus according to claim 1, further comprising
a detecting unit that detects an unstable operation of the semiconductor processing apparatus based on the measured value of the result and a predetermined output threshold value,
wherein the output unit outputs a detection result obtained by the detecting unit.

8. The search method that is executed by a search apparatus, the search apparatus executes:
an input process of receiving each input of a target value, which indicates a condition to be set in a semiconductor processing apparatus to process a semiconductor or a result obtained by processing the semiconductor using the semiconductor processing apparatus, a reference value of the condition inside a search area defined by ranges of the condition and the result, and the result, the reference value indicated by the target value;
a generating process of generating a prediction model indicating a relation between the condition and the result based on a setting value of the condition inside the search area, a measured value of the result obtained when the setting value is assigned to the semiconductor processing apparatus;
a specifying process of acquiring a prediction value from the prediction model by assigning the target value input in the input process to the prediction model generated in the generating process, and specifying a presence area of the prediction value from the search area;
a determining process of determining whether the measured value of the result corresponding to the prediction value is closer to the target value than the reference value input in the input process;
a setting process of setting the prediction value to the reference value when it is determined that the prediction value is closer to the target value in the determining process, and setting the prediction value presence area specified in the specifying process to the search area; and
an output process of outputting a prediction value satisfying an achievement condition when the prediction value satisfies the achievement condition of the target value.

9. The search method according to claim 8, the search apparatus further executes
a deciding process of deciding the prediction value inside the presence area and the measured value of the result corresponding to the prediction value as exclusion data when it is determined that the measured value of the result corresponding to the prediction value is not closer to the target value in the determining process,
wherein, in the setting process, the search apparatus sets a remaining area obtained by excluding an exclusion area, which is specified based on the exclusion data decided in the deciding process and a target value assigned to the semiconductor processing apparatus when the exclusion data is obtained, from the search area as the search area.

10. The search method according to claim 8, the search apparatus further executes
a dividing process of dividing the search area into a plurality of areas,
wherein, in the specifying process, the search apparatus sets the prediction value to the reference value when it is determined that the measured value of the result corresponding to the prediction value is closer to the target value in the determining process, and specifies the prediction value presence area, specified in the specifying process, among a plurality of division areas obtained in the dividing process.

11. The search method according to claim 8, the search apparatus further executes
a dividing process of dividing the search area into a plurality of areas,
wherein, in the generating process, the search apparatus acquires the measured value of the result, obtained when the condition setting value inside the division area obtained in the dividing process is assigned to the semiconductor processing apparatus, for each of the division areas, and generates the prediction model based on the condition setting values in the respective division areas and the measured value of the result.

12. The search method according to claim 8, wherein
in the setting process, the search apparatus sets the prediction value presence area to the search area when it is determined that the measured value of the result corresponding to the prediction value is not closer to the target value in the determining process, instead of setting the prediction value to the reference value.

13. The search method according to claim 8, the search apparatus further executes
a deciding process of deciding the prediction value inside the prediction value presence area as exclusion data when it is determined that the measured value of the result corresponding to the prediction value is not closer to the target value in the determining process,
wherein, in the generating process, the search apparatus generates the prediction model based on a specific measured value obtained by excluding the exclusion data from the measured value and a specific setting value obtained by excluding a setting value, assigned to the semiconductor processing apparatus when the exclusion data is obtained, from the setting value.

14. The search method according to claim 8, the search apparatus further executes
a detecting process of detecting an unstable operation of the semiconductor processing apparatus based on the measured value of the result and a predetermined output threshold value,
wherein, in the output process, the search apparatus outputs a detection result obtained in the detecting process.

* * * * *